United States Patent
Abuelnaga et al.

(10) Patent No.: US 11,342,878 B1
(45) Date of Patent: May 24, 2022

(54) REGENERATIVE MEDIUM VOLTAGE DRIVE (CASCADED H BRIDGE) WITH REDUCED NUMBER OF SENSORS

(71) Applicant: Rockwell Automation Technologies, Inc., Mayfield Heights, OH (US)

(72) Inventors: Ahmed Hisham Abuelnaga, Hamilton (CA); Mehdi Narimani, Oakville (CA); Zhongyuan Cheng, Kitchener (CA); Navid R. Zargari, Cambridge (CA)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 17/227,143

(22) Filed: Apr. 9, 2021

(51) Int. Cl.
*H02P 27/08* (2006.01)
*H02M 1/44* (2007.01)
*H02M 5/458* (2006.01)
*H03L 7/08* (2006.01)

(52) U.S. Cl.
CPC .............. *H02P 27/08* (2013.01); *H02M 1/44* (2013.01); *H02M 5/4585* (2013.01); *H03L 7/08* (2013.01)

(58) Field of Classification Search
CPC .......... H02P 13/00; H02P 13/06; H02P 21/00; H02P 21/0017; H02P 21/14; H02P 21/22; H02P 23/00; H02P 23/0022; H02P 23/06; H02P 23/07; H02P 23/14; H02P 25/00; H02P 25/064; H02P 25/22; H02P 27/00; H02P 27/04; H02P 27/06; H02P 27/08; H02P 27/085; H02P 3/14; H02P 3/00; H02P 1/00; H02P 1/04; H02P 1/12; H02P 1/26; H02P 1/46; H02P 1/465; H02P 6/34
See application file for complete search history.

(56) References Cited

U.S. PATENT DOCUMENTS

| | | | |
|---|---|---|---|
| 2,694,155 | A | 11/1954 | Bates |
| 2,851,640 | A | 9/1958 | Bernadyn |
| 3,154,726 | A | 10/1964 | McClain |
| 4,136,382 | A | 1/1979 | Ricci |
| 4,443,841 | A | 4/1984 | Mikami et al. |
| 4,471,855 | A | 9/1984 | Nomura |
| 4,503,316 | A | 3/1985 | Murase et al. |

(Continued)

FOREIGN PATENT DOCUMENTS

| | | |
|---|---|---|
| CN | 1190278 | 8/1998 |
| CN | 1253999 | 5/2000 |

(Continued)

OTHER PUBLICATIONS

Abu-Rub et al.,"Medium-Voltage Multilevel Converters—State of the Art, Chellenges, and Requirements in Industrial Applications", IEEE Transactions on Industrial Electronics, vol. 57, No. 8, Aug. 2010, pp. 2581-2596.

(Continued)

*Primary Examiner* — Antony M Paul
(74) *Attorney, Agent, or Firm* — Fay Sharpe LLP

(57) ABSTRACT

A regenerative power conversion system with a phase shift transformer having a primary circuit and N secondary sets of M secondary circuits, a controller synchronizes rectifier switching control signals of individual regenerative power stages to a phase angle of a corresponding one of the secondary circuits based on a feedback signal of the primary circuit during regenerative operation of the power conversion system.

21 Claims, 23 Drawing Sheets

(56) References Cited

U.S. PATENT DOCUMENTS

| | | |
|---|---|---|
| 4,545,464 A | 10/1985 | Nomura |
| 4,599,519 A | 7/1986 | Boenig |
| 4,602,147 A | 7/1986 | Gell |
| 4,783,728 A | 11/1988 | Hoffman |
| 4,802,071 A | 1/1989 | Schuster |
| 4,802,079 A | 1/1989 | Mizoguchi |
| 4,894,621 A | 1/1990 | Koenig et al. |
| 5,291,388 A | 3/1994 | Heinrich |
| 5,298,848 A | 3/1994 | Ueda et al. |
| 5,324,990 A | 6/1994 | Cunningham |
| 5,361,196 A | 11/1994 | Tanamachi et al. |
| 5,502,633 A | 3/1996 | Miyazaki et al. |
| 5,625,545 A | 4/1997 | Hammond |
| 5,638,263 A | 6/1997 | Opal et al. |
| 5,642,275 A | 6/1997 | Peng et al. |
| 5,790,396 A | 8/1998 | Miyazaki et al. |
| 5,875,106 A | 2/1999 | Tenconi et al. |
| 5,933,339 A | 8/1999 | Duba et al. |
| 5,986,909 A | 11/1999 | Hammond et al. |
| 6,005,788 A | 12/1999 | Lipo et al. |
| 6,014,323 A | 1/2000 | Aiello et al. |
| 6,031,738 A | 2/2000 | Lipo et al. |
| 6,058,031 A | 5/2000 | Lyons et al. |
| 6,075,350 A | 6/2000 | Peng |
| 6,075,717 A | 6/2000 | Kumar et al. |
| 6,101,109 A | 8/2000 | Duba et al. |
| 6,151,227 A | 11/2000 | Mizutini et al. |
| 6,166,513 A | 12/2000 | Hammond |
| 6,166,929 A | 12/2000 | Ma et al. |
| 6,222,284 B1 | 4/2001 | Hammond et al. |
| 6,229,722 B1 * | 5/2001 | Ichikawa ............... H02M 7/49 363/71 |
| 6,236,580 B1 | 5/2001 | Aiello et al. |
| 6,269,010 B1 | 7/2001 | Ma et al. |
| 6,295,215 B1 | 9/2001 | Faria et al. |
| 6,320,767 B1 | 11/2001 | Shimoura et al. |
| 6,359,416 B1 | 3/2002 | Rao et al. |
| 6,366,483 B1 | 4/2002 | Ma et al. |
| 6,411,530 B2 | 6/2002 | Hammond et al. |
| 6,477,067 B1 | 11/2002 | Kerkman et al. |
| 6,469,916 B1 | 12/2002 | Kerkman et al. |
| 6,541,933 B1 | 4/2003 | Leggate et al. |
| 6,542,390 B2 | 4/2003 | Bixel |
| 6,556,461 B1 | 4/2003 | Khersonsky et al. |
| 6,617,821 B2 | 9/2003 | Kerkman et al. |
| 6,636,012 B2 | 10/2003 | Royak et al. |
| RE38,439 E | 2/2004 | Czerwinski |
| 6,697,271 B2 | 2/2004 | Corzine |
| 6,697,274 B2 | 2/2004 | Bernet et al. |
| 6,703,809 B2 | 3/2004 | Royak et al. |
| 6,720,748 B1 | 4/2004 | Seibel et al. |
| 6,741,482 B2 * | 5/2004 | Yamamoto ............. H02M 1/4216 363/37 |
| 6,762,947 B2 | 7/2004 | Hammond |
| 6,795,323 B2 | 9/2004 | Tanaka et al. |
| 6,819,070 B2 | 11/2004 | Kerkman et al. |
| 6,819,077 B1 | 11/2004 | Seibel et al. |
| 6,842,354 B1 | 1/2005 | Tallam et al. |
| 6,847,531 B2 | 1/2005 | Bixel |
| 6,859,374 B2 | 2/2005 | Pollanen et al. |
| 6,982,533 B2 | 1/2006 | Seibel et al. |
| 7,034,501 B1 | 4/2006 | Thunes et al. |
| 7,057,905 B2 | 6/2006 | Macmillan |
| 7,068,526 B2 | 6/2006 | Yamanaka |
| 7,106,025 B1 | 9/2006 | Yin et al. |
| 7,164,254 B2 | 1/2007 | Kerkman et al. |
| 7,170,767 B2 | 1/2007 | Bixel |
| 7,180,270 B2 | 2/2007 | Rufer |
| 7,215,559 B2 | 5/2007 | Nondahl et al. |
| 7,274,576 B1 | 9/2007 | Zargari et al. |
| 7,336,509 B2 | 2/2008 | Tallam |
| 7,342,380 B1 | 3/2008 | Kerkman et al. |
| 7,356,441 B2 | 4/2008 | Kerkman et al. |
| 7,400,518 B2 | 7/2008 | Yin et al. |
| 7,428,158 B2 | 9/2008 | Bousfield, III et al. |
| 7,471,525 B2 | 12/2008 | Suzuki et al. |
| 7,495,410 B2 | 2/2009 | Zargari et al. |
| 7,495,938 B2 | 2/2009 | Wu et al. |
| 7,508,147 B2 | 3/2009 | Rastogi et al. |
| 7,511,976 B2 | 3/2009 | Zargari et al. |
| 7,568,931 B2 | 8/2009 | Hammond |
| 7,589,984 B2 | 9/2009 | Salomaki |
| 7,649,281 B2 | 1/2010 | Lai et al. |
| 7,800,254 B2 | 9/2010 | Hammond |
| 7,830,681 B2 | 11/2010 | Abolhassani et al. |
| 7,894,224 B2 | 2/2011 | Ulrich |
| 7,978,488 B2 | 7/2011 | Tanaka et al. |
| 8,008,923 B2 | 8/2011 | Hammond |
| 8,040,101 B2 | 10/2011 | Itoh et al. |
| 8,093,764 B2 | 1/2012 | Hammond |
| 8,107,267 B2 | 1/2012 | Tallam et al. |
| 8,130,501 B2 | 3/2012 | Ledezma et al. |
| 8,138,697 B2 | 3/2012 | Palma |
| 8,144,491 B2 | 3/2012 | Bendre et al. |
| 8,159,840 B2 | 4/2012 | Yun |
| 8,279,640 B2 | 10/2012 | Abolhassani et al. |
| 8,400,793 B2 | 3/2013 | Jonsson |
| 8,441,147 B2 | 5/2013 | Hammond |
| 8,508,066 B2 | 8/2013 | Lee et al. |
| 8,581,147 B2 | 11/2013 | Kooken et al. |
| 8,619,446 B2 | 12/2013 | Liu et al. |
| 8,817,499 B2 | 8/2014 | Videt |
| 8,860,380 B2 | 10/2014 | Hasler |
| 8,929,111 B2 | 1/2015 | White |
| 8,963,478 B2 | 2/2015 | Becerra et al. |
| 8,982,593 B2 | 3/2015 | Nondahl et al. |
| 9,036,379 B2 | 5/2015 | Schroeder |
| 9,054,599 B2 | 6/2015 | Wei et al. |
| 9,300,220 B2 | 3/2016 | Chen et al. |
| 9,325,252 B2 | 4/2016 | Narimani et al. |
| 9,812,990 B1 | 11/2017 | Cheng et al. |
| 2001/0048290 A1 | 12/2001 | Underwood et al. |
| 2003/0053324 A1 * | 3/2003 | Yamamoto ............. H02M 1/4216 363/127 |
| 2004/0267468 A1 | 12/2004 | Luethen et al. |
| 2007/0211501 A1 | 9/2007 | Zargari et al. |
| 2007/0297202 A1 | 12/2007 | Zargari et al. |
| 2008/0079314 A1 | 4/2008 | Hammond |
| 2008/0081244 A1 | 4/2008 | Hammond |
| 2008/0088186 A1 | 4/2008 | Hammond |
| 2008/0174182 A1 | 7/2008 | Hammond |
| 2008/0180055 A1 | 7/2008 | Zargari et al. |
| 2009/0073622 A1 | 3/2009 | Hammond |
| 2009/0085510 A1 | 4/2009 | Pande et al. |
| 2009/0128083 A1 | 5/2009 | Zargari |
| 2009/0184681 A1 | 7/2009 | Kuno |
| 2010/0025995 A1 | 2/2010 | Lang et al. |
| 2010/0078998 A1 | 4/2010 | Wei et al. |
| 2010/0080028 A1 | 4/2010 | Cheng et al. |
| 2010/0085789 A1 | 4/2010 | Ulrich et al. |
| 2010/0091534 A1 | 4/2010 | Tadano |
| 2010/0109585 A1 | 5/2010 | Iwahori et al. |
| 2010/0141041 A1 | 6/2010 | Bose et al. |
| 2010/0301975 A1 | 12/2010 | Hammond |
| 2011/0019449 A1 | 1/2011 | Katoh et al. |
| 2011/0095603 A1 | 4/2011 | Lee et al. |
| 2011/0249479 A1 | 10/2011 | Capitaneanu et al. |
| 2012/0057380 A1 | 3/2012 | Abe |
| 2012/0057384 A1 | 3/2012 | Jones |
| 2012/0113698 A1 | 5/2012 | Inoue |
| 2012/0195078 A1 | 8/2012 | Kroeze et al. |
| 2012/0195079 A1 | 8/2012 | Kroeze et al. |
| 2012/0195087 A1 | 8/2012 | Kroeze et al. |
| 2012/0201056 A1 | 8/2012 | Wei et al. |
| 2012/0212982 A1 | 8/2012 | Wei et al. |
| 2012/0218795 A1 | 8/2012 | Mihalache |
| 2012/0306716 A1 | 12/2012 | Satake et al. |
| 2013/0010504 A1 | 1/2013 | Xiao et al. |
| 2013/0044526 A1 | 2/2013 | Soua |
| 2013/0121041 A1 | 5/2013 | Schroeder et al. |
| 2013/0121042 A1 | 5/2013 | Gan et al. |
| 2013/0148390 A1 | 6/2013 | Na |
| 2013/0223651 A1 | 8/2013 | Hoyerby |
| 2013/0249322 A1 | 9/2013 | Zhang et al. |

(56) References Cited

U.S. PATENT DOCUMENTS

| | | |
|---|---|---|
| 2013/0270917 A1 | 10/2013 | Yatsu |
| 2013/0272045 A1 | 10/2013 | Soeiro |
| 2013/0300380 A1 | 11/2013 | Brunotte et al. |
| 2014/0003099 A1 | 1/2014 | Dillig et al. |
| 2014/0036557 A1 | 2/2014 | Liu et al. |
| 2014/0042817 A1 | 2/2014 | Zargari et al. |
| 2014/0063870 A1 | 3/2014 | Bousfield, III |
| 2014/0098587 A1 | 4/2014 | Yatsu |
| 2014/0146586 A1 | 5/2014 | Das et al. |
| 2014/0177293 A1 | 6/2014 | Eckhardt et al. |
| 2014/0204632 A1 | 7/2014 | Noetzold et al. |
| 2014/0268928 A1 | 9/2014 | Wie et al. |
| 2014/0268967 A1 | 9/2014 | White et al. |
| 2014/0293667 A1 | 10/2014 | Shroeder et al. |
| 2014/0300298 A1 | 10/2014 | Liu et al. |
| 2014/0376287 A1 | 12/2014 | Wu et al. |
| 2015/0009731 A1 | 1/2015 | Kim |
| 2015/0171733 A1 | 6/2015 | Zargari et al. |
| 2015/0180369 A1 | 6/2015 | Nondahl et al. |
| 2015/0194902 A1 | 7/2015 | Tian |
| 2015/0280608 A1 | 10/2015 | Yoscovich et al. |
| 2016/0268948 A1 | 9/2016 | Choi et al. |
| 2016/0336872 A1 | 11/2016 | Cheng et al. |
| 2017/0366082 A1 | 12/2017 | Liu et al. |

FOREIGN PATENT DOCUMENTS

| | | |
|---|---|---|
| CN | 1414692 | 4/2003 |
| CN | 2577503 | 10/2003 |
| CN | 190885 C | 2/2005 |
| CN | 1400731 A | 3/2005 |
| CN | 2737060 | 10/2005 |
| CN | 1925289 | 3/2007 |
| CN | 101795057 A | 8/2010 |
| CN | 102005960 A | 4/2011 |
| CN | 102195460 A | 9/2011 |
| CN | 102290828 A | 12/2011 |
| CN | 102522913 A | 6/2012 |
| CN | 102624025 A | 8/2012 |
| CN | 102739030 A | 10/2012 |
| CN | 102983568 A | 3/2013 |
| CN | 103051167 A | 4/2013 |
| CN | 103051236 A | 4/2013 |
| CN | 103078539 A | 5/2013 |
| CN | 103312257 A | 9/2013 |
| CN | 103337951 A | 10/2013 |
| EP | 0874448 | 10/1998 |
| EP | 1641111 A2 | 3/2006 |
| EP | 1713168 A2 | 10/2006 |
| EP | 2075907 A1 | 7/2009 |
| EP | 2568591 A1 | 3/2013 |
| EP | 2698912 A2 | 2/2014 |
| EP | 2838189 A2 | 2/2015 |
| ES | 2378865 | 4/2012 |
| GB | 1295261 A | 11/1972 |
| GB | 2345594 A | 7/2000 |
| JP | 2006223009 | 8/2006 |
| JP | 2007174792 A | 7/2007 |
| JP | 2012147613 A | 8/2012 |
| JP | 2013012674 | 1/2013 |
| KR | 20080061641 A | 7/2008 |
| TW | 439350 | 6/2001 |
| WO | WO2006107548 | 10/2006 |
| WO | WO2012105737 A1 | 8/2012 |
| WO | WO2013091675 A1 | 6/2013 |
| WO | WO2013104418 A1 | 7/2013 |
| WO | WO2013001820 A1 | 2/2015 |
| WO | WO2015155112 A1 | 10/2015 |

OTHER PUBLICATIONS

Akagi et al., "A Passive EMI Filter for Eliminating Both Bearing Current and Ground Leakage Current From an Inverter-Driven Motor", IEEE Transactions on Power Electronics, 2006, pp. 1459-1469.

Akagi et al., "An Approach to Eliminating High-Frequency Shaft Voltage and Ground Leakage Current From an Inverter-Driven Motor", IEEE Transactions on Industry Applications, 2004, pp. 1162-1169.

ALTIVAR 1000, "The new range of medium-voltage variable speed drives", Hi-performance compact designs from 0.5 to 10MW, Schneider Electric-Automation—Motion & Drives, Jul. 2008, 34 pgs, obtained from the World Wide Web Apr. 2013.

Angulo, Mauricio, et al., "Level-shifted PMW for Cascaded Multilevel Inverters with Even Power Distribution", IEEE Power Electronics Specialists Conference (PESC), pp. 2373-2378, Jun. 2007.

Apeldoorn et al., "A 16 MVA ANPC-PEBB with 6 ka IGCTs," in Conf. Rec. 40th IEEE IAS Annu. Meeting, Oct. 2-6, 2005, vol. 2, pp. 818-824.

Barbosa et al., "Active neutral-point-clamped multilevel converters," in Proc. IEEE 36th Power Electron. Spec. Conf., Jun. 16, 2005, pp. 2296-2301.

Bruckner et al., "The active NPC converter and its loss-balancing control," IEEE Trans. Ind. Electron., vol. 52, No. 3, pp. 855-868, Jun. 2005.

Cacciato et al., "Modified space-vector-modulation technique for common mode currents reduction and full utilization of the DC bus", in Proc. IEEE APEC Conf. Rec., 2009, pp. 109-115.

Cacciato et al., "Reduction of common mode currents in PWM inverter motor drives", IEEE Trans. Ind. Appl., vol. 35, No. 2, pp. 469-476, Mar./Apr. 1999.

Cavalcanti et al., "Modulation Techniques to Eliminate Leakage Currents in Transformerless Three-Phase Photovoltaic Systems", IEEE Transactions on Industrial Electronics, 2010, pp. 1360-1368.

Celanovic et al., "A Comprehensive Study of Neutral-Point Voltage Balancing Problem in Three-Level Neutral-Point-Clamped Voltage Source PWM Inverters", IEEE Transactions on Power Electronics, vol. 15, No. 2, Mar. 2000, pp. 242-249.

Cengelci, E., et al., A New Medium Voltage PWM Inverter Topology for Adjustable Speed Drives, IEEE, 0-7803-4943-1, 1998, pp. 1416-1423.

Cha, Han Ju et al. An Approach to Reduce Common-Mode Voltage in Matrix Converter, Jul./Aug. 2003, IEEE, vol. 39, pp. 1151-1159.

Cha, Han Ju, "Analysis and Design of Matrix Converter for Adjustable Speed Drive and Distributed Power Sources", Aug. 2004, Texas A&M Univ., Doctor of Philosophy Dissertation Paper.

Chaudhuri, Toufann, et al., Introducing the Common Cross Connected Stage ($C^3S$) for the 5L ANPC Multilevel Inverter, IEEE, 978-1-4244-1668-4, 2008, pp. 167-173.

Cheng et al., "A novel switching sequence design for five-level NPC/H-bridge inverters with improved output voltage spectrum and minimized device switching frequency," IEEE Trans. Power Electron., vol. 22, No. 6, p. 213 8-2145, Nov. 2007.

Choi et al., "A General Circuit Topology of Multilevel Inverter", Dept. of Electrical Engineering, Korea Advanced Institute of Science and Technology (KAIST), 1991 IEEE, 8 pgs.

De Broe, et al., "Neutral-To-Ground Voltage Minimization in a PWM-Rectifier/Inverter Configuration", Power Electronics and Variable Speed Drives, Sep. 23-25, 1996, Conference Publication No. 429, IEEE, 1996.

Erdman, Russel J. Kerkman, David W. Schlegel, and Gary L. Skibinski, "Effect of PWM Inverters on AC Motor Bearing Currents and Shaft Voltages", 1996 IEEE.

Etxeberria-Otadui et al., Gaztaaga, U. Viscarret, and M. Caballero, "Analysis of a H-NPC topology for an AC traction front-end converter," in Proc. 13th EPE-PEMC, Sep. 1-3, 2008, pp. 1555-1561.

Floricau, Dan et al., A new stacked NPC converter: 3L-topology and control, Proceedings of the 12th European Conf. on Power Electronics and Applications, EPE 2007, EPE Association, 2007, 10 pgs.

Ghias et al., "Performance Evaluation of a Five-Level Flying Capacitor Converter with Reduced DC Bus Capacitance Under Two Different Modulation Schemes", Power Electronics for Distributed Generation Systems (PEDG); 2012 $3^{rd}$ IEEE Int'l Symposium, IEEE, Jun. 25, 2012; pp. 857-864.

(56) References Cited

OTHER PUBLICATIONS

Ghias et al., "Voltage Balancing Strategy for a Five-Level Flying Capacitor Converter Using Phase Disposition PWM with Sawtooth-Shaped Carriers"; IECON 2012-38$^{th}$ annual Conf., IEEE Industrial Electronics Society; Oct. 25, 2012; pp. 5013-5019.

Glinka, M., Prototype of Multiphase Modular-Multilevel-Converter with 2 MW power rating and 17-level-output-voltage, IEEE, 0-7803-8399-0, 2004, pp. 2572-2576.

Guennegues et al., "Selective harmonic elimination PWM applied to H-bridge topology in high speed applications," in Proc. Int. Conf. POWERENG, Mar. 18-20, 2009, pp. 152-156.

Guennegues, V., et al., A Converter Topology for High Speed Motor Drive Applications, IEEE Xplore, 2009, 8 pgs.

Gupta et al., "A Space Vector Modulation Scheme to Reduce Common Mode Voltage for Cascaded Multilevel Inverters", IEEE Transactions on Power Electronics, vol. 22, No. 5, Sep. 2007, pp. 1672-1681.

Hava et al., "A high-performance PWM algorithm for common-mode voltage reduction in three-phase voltage source inverters," IEEE Trans. Power Electron., vol. 26, No. 7, pp. 1998-2008, Jul. 2011.

Hiller, Mark et al., Medium-Voltage Drives; An overview of the common converter topologies and power semiconductor devices, IEEE Industry Applications Magazine, Mar.-Apr. 2010, pp. 22-30.

Horvath, "How isolation transformers in MV drives protect motor insulation", TM GE Automation Systems, Roanoke, VA, 2004.

Hua, Lin, "A Modulation Strategy to Reduce Common-Mode Voltage for Current-Controlled Matrix Converters", Nov. 2006, IEEE Xplore, pp. 2775-2780.

Iman-Eini, Hossein et al., "A Fault-Tolerant Control Strategy for Cascaded H-Bridge Multilevel Rectifiers", Journal of Power Electronics, vol. 1, Jan. 2010.

Kerkman, et al., "PWM Inverters and Their Influence on Motor Over-Voltage," 1997 IEEE.

Khomfoi, Surin et al., "Fault Detection and Reconfiguration Technique for Cascaded H-bridge 11-level Inverter Drives Operating under Faulty Condition", 2007 IEEE, Peds 2007, pp. 1035-1042.

Kieferndorf et al., "A new medium voltage drive system based on anpc-51 technology," in Proc. IEEE-ICIT, Viña del Mar, Chile, Mar. 2010,pp. 605-611.

Kim et al., "A New PWM Strategy for Common-Mode Voltage Reduction in Neutral-Point-Clamped Inverter-Fed AC Motor Drives", IEEE Translations on Industry Applications, vol. 37, No. 6, Nov. 2001, pp. 1480-1845.

Kouro et al., "Recent advances and industrial applications of multilevel converters," IEEE Trans. Ind. Electron., vol. 57, No. 8, pp. 2553-2580, Aug. 2010.

Lai et al., "Optimal common-mode voltage reduction PWM technique for inverter control with consideration of the dead-time effects-part I: basic development," IEEE Trans. Ind. Appl., vol. 40, No. 6, pp. 1605-1612, Nov./Dec. 2004.

Lee, Hyeoun-Dong et al., "A Common Mode Voltage Reduction in Boost Rectifier/Inverter System by Shifting Active Voltage Vector in a Control Period", IEEE Transactions on Power Electronics, vol. 15, No. 6, Nov. 2000.

Lesnicar et al., "An Innovative Modular Multilevel Converter Topology Suitable for a Wide Power Range", 2003 IEEE Bologna PowerTech Conference, Jun. 23-26, Bologna Italy, 6 pgs.

Lesnicar, A., et al., A new modular voltage source inverter topology, Inst. of Power Electronics and Control, Muenchen, DE, Oct. 10, 2007, pp. 1-10.

Lezana, Pablo et al., "Survey on Fault Operation on Multilevel Inverters", IEEE Transactions on Industrial Electronics, vol. 57, No. 7, Jul. 2010, pp. 2207-2217.

Li, Jun, et al., A New Nine-Level Active NPC (ANPC) Converter for Grid Connection of Large Wind Turboines for Distributed Generation, IEEE Transactions on Power Electronics, vol. 26, No. 3, Mar. 2011, pp. 961-972.

Loh et al., "Reduced Common-Mode Modulation Strategies for Cascaded Multilevel Inverters", IEEE Transaction on Industry Applications, vol. 39, No. 5, Sep. 2003, pp. 1386-1395.

Maia et al., "Associating PWM and Balancing Techniques for Performance Improvement of Flying Capacitor Inverter"; 2013 Brazilian Power Electronics Conf., IEEE; Oct. 27, 2013; pp. 92-99.

McGrath, Brendan Peter et al., "Multicarrier PMW Strategies for Multilevel Inverters," IEEE Transactions on Industrial Electronics, vol. 49, No. 4, pp. 858-867, Aug. 2002.

Meili et al., "Optimized pulse patterns for the 5-level ANPC converter for high speed high power applications," in Proc. 32nd IEEE IECON, Nov. 6-10, 2006, pp. 2587-2592.

Muetze & A. Binder, "Don't lose Your Bearings", Mitigation techniques for bearing currents in inverter-supplied drive systems, 2006 IEEE.

Naik et al., "Circuit model for shaft voltage prediction in induction motors fed by PWMbased AC drives", IEEE Trans. Ind. Appl., vol. 39, No. 5, pp. 1294-1299, Nov./Dec. 1996.

O-Harvest, product information, Beijing Leader & Harvest Electric Technologies Co., Ltd., http:/www.ld-harvest.com/en/3-1-2.htm, retrieved from the Internet Apr. 11, 2013, 3 pgs.

Park, Young-Min, "A Simple and Reliable PWM Synchronization & Phase-Shift Method for Cascaded H-Bridge Multilevel Inverters based on a Standard Serial Communication Protocol", IEEE 41$^{st}$ IAS Annual Meeting, pp. 988-994, Oct. 2006.

Peng, "A Generalized Multilevel Inverter Topology with Self Voltage Balancing", IEEE Transactions on Industry Applications, vol. 37, No. 2, Mar./Apr. 2001, pp. 611-618.

Perez, Marcelo A., et al. "Regenerative medium-voltage AC drive based on a multicell arrangement with reduced energy storage requirements." IEEE Transactions on Industrial Electronics 52.1 (2005): 171-180.

Rashidi-Rad et al., "Reduction of Common-Mode Voltage in an Even Level Inverter by a New SVM Method", Int'l Journal of Advanced Computer Science, vol. 2, No. 9, pp. 343-347, Sep. 2012.

Rendusara, et al., "Analysis of common mode voltage-'neutral shift' in medium voltage PWM adjustable speed drive (MV-ASD) systems", IEEE Trans. Power Electron., vol. 15, No. 6, pp. 1124-1133, Nov. 2000.

Robicon Perfect Harmony, "Medium-Voltage Liquid-Cooled Drives", Siemens, Catalog D 15.1, 2012, USA Edition, obtained from the World Wide Web Apr. 2013, 91 p. (Downloaded to EFS Web as Part 1, pp. 1-49; and Part 2, pp. 50-91).

Robicon Perfect Harmony, "The Drive of Choice for Highest Demands", Siemens, Copyright Siemens AG 2008, 16 pgs, .obtained from the World Wide Web Apr. 2013.

Robicon, "Perfect Harmony MV Drive Product Overview", 18 pgs., obtained from the World Wide Web Apr. 2013.

Rodriguez et al., "A New Modulation Method to Reduce Common-Mode Voltages in Multilevel Inverters", IEEE Transactions on Industrial Electronics, vol. 51, No. 4, Aug. 2004, 834-939.

Rodriguez et al., "Multilevel inverters: A survey of topologies, controls, and applications," IEEE Trans. Ind. Electron., vol. 49, No. 4, pp. 724-738, Aug. 2002.

Rodriguez et al., "Operation of a Medium-Voltage Drive Under Faulty Conditions", IEEE Transactions on Industrial Electronics, vol. 52, No. 4, Aug. 2005, pp. 1080-1085.

Rodriguez, et al., "Multilevel voltage source-converter topologies for industrial medium-voltage drives," IEEE Trans. Ind. Electron., vol. 54, No. 6, pp. 2930-2945, Dec. 2007.

Saeedifard, et al., "Operation and control of a hybrid seven-level converter," IEEE Trans. Power Electron., vol. 27, No. 2, pp. 652-660, Feb. 2012.

Saeedifard, Maryann et al., Analysis and Control of DC-Capacitor-Voltage-Drift Phenomenon of a Passive Front-End Five-Level Converter, IEEE Transactions on Industrial Electronics, vol. 54, No. 6, Dec. 2007, pp. 3255-3266.

Sedghi, S et al., "A New Multilevel Carrier Based Pulse Width Modulation Method for Modular Multilevel Inverter", IEEE, 8$^{th}$ International Conference on Power Electronics—ECCE Asia (ICPE & ECCE), pp. 1432-1439, May 30-Jun. 3, 2011.

(56) References Cited

OTHER PUBLICATIONS

Sepahvand, Hossein et al., "Fault Recovery Strategy for Hybrid Cascaded H-Bridge Multi-Level Inverters", 2011 IEEE, pp. 1629-1633.
Serpa et al., "Fivelevel virtual-flux direct power control for the active neutral-point clamped multilevel inverter," in Proc. IEEE Power Electron. Spec. Conf.
Silva, Cesar et al., Control of an Hybrid Multilevel Inverter for Current Waveform Improvement, IEEE, 978-1-4244-1666-0, 2008, pp. 2329-2335.
Song, Wenchao et al., "Control Strategy for Fault-Tolerant Cascaded Multilevel Converter based STATCOM", 2007 IEEE, pp. 1073-1076.
Tang et al. An Integrated Dual Voltage Loop Control for Capacitance Reduction in CHB=based Regenerative Motor Drive Systems. IEEE Transactions on Industrial Electronics. Jul. 16, 2018, 11 pages.
Ulrich, James A., et al., Floating Capacitor Voltage Regulation in Diode Clamped Hybrid Multilevel Converters, IEEE, 978-1-4244-3439-8, 2009, pp. 197-202.
Un et al., "A near-state PWM method with reduced switching losses and reduced common-mode voltage for three-phase voltage source inverters," IEEE Trans. Ind. Appl., vol. 45, No. 2, pp. 782-793, Mar./Apr. 2009.
Wang, "Motor shaft voltages and bearing currents and their reduction in multilevel medium-voltage PWM voltage-source-inverter drive applications", IEEE Trans. Ind. Appl., vol. 36, No. 5, pp. 1336-1341, Sep./Oct. 2000.
Wei, Sanmin et al., "Control Method for Cascaded H-Bridge Multilevel Inverter with Faulty Power Cells", 2003 IEEE, pp. 261-267.
Wen, Jun et al., Synthesis of Multilevel Converters Based on Single-and/or Three-Phase Converter Building Blocks, IEEE Transactions on Power Electronics, vol. 23, No. 3, May 2008, pp. 1247-1256.
Wu et al., "A five-level neutral-point-clamped H-bridge PWM inverter with superior harmonics suppression: A theoretical analysis," in Proc. IEEE Int. Symp. Circuits Syst., Orlando, FL, May 30-Jun. 2, 1999, vol. 5, pp. 198-201.
Wu, Bin, "EE8407 Power Converter Systems", Topic 6, Multilevel Cascaded H-Bridge (CHB) Inverters, pp. 1-14, 2006.
Wu, Bin, "High-Power Converters and AC Drives", Wiley-IEEE Press, 2006, Chapter 7, pp. 119-142.
Wu, Bin, "High-Power Converters and AC Drives", Wiley-IEEE Press, 2006, Chapter 9, pp. 179-186.
Wu, High-Power Converters and AC Drives. New York/Piscataway, NJ: Wiley/IEEE Press, 2006, Ch. 1.
Yantra Harvest Energy Pvt. Ltd., "Medium Voltage Drives", www.yantraharvest.com, obtained from the World Wide Web Apr. 2013.
Yang, et al. "Power Decoupling Control for Capacitance Reduction in Cascaded H-Bridge Converter-based Regenerative Motor Drive Systems." IEEE Transactions on Power Electronics. Mar. 23, 2018, 12 pages.
Yin, et al., "Analytical Investigation of the Switching Frequency Harmonic Characteristic for Common Mode Reduction Modulator", 2005 IEEE.
Zhang et al., "A Multilevel Converter Topology with Common Flying Capacitors", IEEE 978-1-4799-0336, 2013, pp. 1274-1280.
Zhang et al., "Multilevel Inverter Modulation Schemes to Eliminate Common-Mode Voltages", IEEE Transactions on Industry Applications, vol. 36, No. 6, Nov./Dec. 2000, pp. 1645-1653.
Zhao, et al., "Hybrid Selective Harmonic Elimination PWM for Common-Mode Voltage Reduction in Three-Level Neutral-Point-Clamped Inverters for Variable Speed Induction Drives", IEEE Transactions on Power Electronics, 2012, pp. 1152-1158.
Zhao, Jing et al., "A Novel PWM Control Method for Hybrid-Clamped Multilevel Inverters", IEEE Transactions on Industrial Electronics, vol. 57, No. 7, pp. 2365-2373, Jul. 2010.
Zhu et al., An Integrated AC Choke Design for Common-Mode Current Suppression in Neutral-Connected Power Converter Systems. IEEE Transactions on Power Electronics, 2012, pp. 1228-1236.

\* cited by examiner

| $V_{sec}$ Range | Reactive Power Controller action $DC_{mode}, V_{DC\_ref}$ | Delay Angle $\alpha$ |
|---|---|---|
| 90% - 110% | $DC_{mode} = 1,$ $V_{DC,min} < V_{DC\text{-}ref} < V_{DC,max}$ | $\alpha = 0$ degrees |
| < 90% | $0 < DC_{mode} < 1$ $V_{DC\text{-}ref} = V_{dc,min}$ | $0 < \alpha < 30$ degrees |

US 11,342,878 B1

REGENERATIVE MEDIUM VOLTAGE DRIVE (CASCADED H BRIDGE) WITH REDUCED NUMBER OF SENSORS

BACKGROUND INFORMATION

The subject matter disclosed herein relates to power converters.

BRIEF DESCRIPTION

In one aspect, a regenerative power conversion system includes a phase shift transformer having a primary circuit and N secondary sets of M secondary circuits, and a controller that synchronizes rectifier switching control signals of individual regenerative power stages to a phase angle of a corresponding one of the secondary circuit based on a feedback signal of the primary circuit during regenerative operation of the power conversion system.

In another aspect, a non-transitory computer readable medium stores computer executable instructions, which, when executed by a processor, cause the processor to sample a feedback signal of a primary circuit of a phase shift transformer, and based on the feedback signal of the primary circuit during regenerative operation of a power conversion system, synchronize rectifier switching control signals provided to rectifier switching devices of each regenerative power stage coupled to a respective secondary circuit of the phase shift transformer, to a phase angle of the respective secondary circuit.

In a further aspect, a method of making a regenerative power conversion system includes storing, in a non-transitory computer readable medium of a controller of the regenerative power conversion system, computer executable instructions, which, when executed by a processor of the controller, cause the processor to sample a feedback signal of a primary circuit of a phase shift transformer, and based on the feedback signal of the primary circuit during regenerative operation of the power conversion system, synchronize rectifier switching control signals provided to rectifier switching devices of each regenerative power stage coupled to a respective secondary circuit of the phase shift transformer, to a phase angle of the respective secondary circuit.

DETAILED DESCRIPTION

Figure 1:
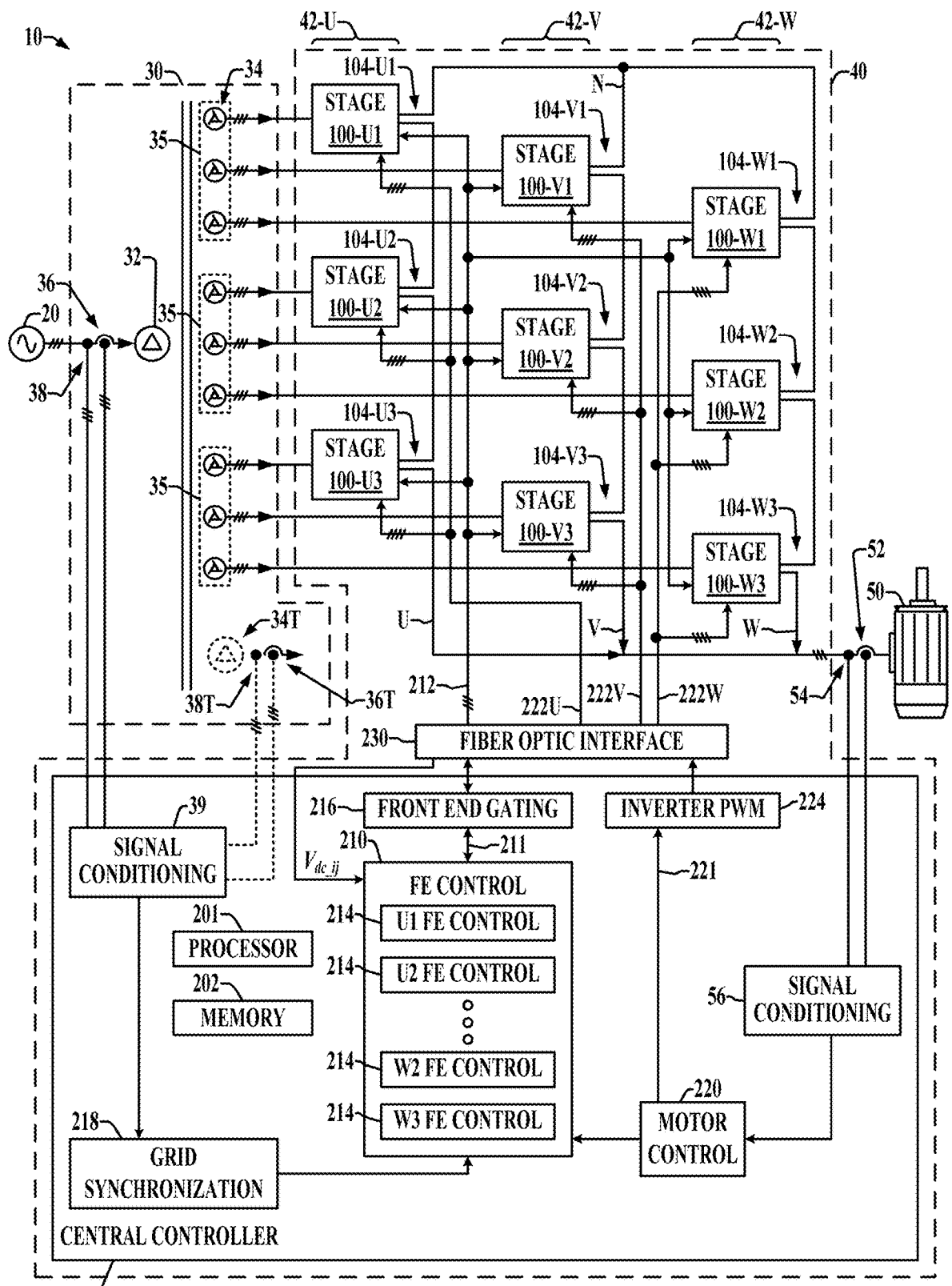
FIG. 1 is a schematic diagram of a power conversion system.

Referring now to the figures, several embodiments or implementations are hereinafter described in conjunction with the drawings, wherein like reference numerals are used to refer to like elements throughout, and wherein the various features are not necessarily drawn to scale. Multilevel inverters are sometimes employed in motor drives and other power conversion applications to generate and provide high voltage drive signals to a motor or other load in high power applications. One form of multilevel inverter is a Cascaded H-Bridge (CHB) inverter architecture, which employs multiple series-connected power stages such as H-Bridge inverters for driving each motor winding phase. Each H-Bridge is powered by a separate DC source and is driven by switch signals to generate positive or negative output voltage, with the series combination of multiple H-Bridge stages providing multilevel inverter output capability for driving a load.

Described examples relate to motor drive type power conversion systems, conversion system controllers, computer readable mediums and manufacturing methods for converters having phase shift transformers and cascaded power stages coupled to corresponding transformer secondary circuits. The described systems provide synchronization of front end switching rectifier switching signals to the secondary voltage and phase angle of a corresponding secondary circuit without requiring secondary side voltage or current sensors. Instead, the illustrated examples use primary side voltage and current sensors along with a synchronizer to synchronize the individual rectifier switching with the phase angle of the corresponding secondary circuit using only the primary side feedback sensing. The synchronization is advantageous for regeneration mode operation in which power is delivered from a motor or other load back to a grid or supply source through selective operation of a front end switching rectifier, such as an active front end (AFE) rectifier operated at a switching frequency higher than the supply frequency or a fundamental front end (FFE) rectifier operating at the line frequency. The disclosed apparatus and methods facilitate significant cost, size and weight reduction for multiphase cascaded H-bridge (CHB) type multilevel converters as no additional sensors required for the regenerative CHB drive version compared to diode front-end CHB drive versions, and keeping the same centralized control system approach as in diode front-end CHB drive version.

For example, in a three-phase, seven-level CHB motor drive system of order N=3 having M=3 sets of N=3 cascaded H-bridge power stages, full sensing of the phase shift transformer secondary voltages and currents for three phase secondary circuits would require 54 sensors. For regenerative converters, supporting AFE or FFE control inside individual power stages means adding more signal electronics into the power stage enclosures, and adversely affects power stage size and enclosure design, power stage cooling design, system reliability, and power stage complexity, as well as increasing system cost. Certain examples described further below provide a centralized grid synchronization unit (CGSU) or synchronizer with a primary locked loop (PLL) to generate a phase angle for the individual secondary circuits using a transformer model. The model can account for tolerances in phase shifting windings angles. These examples reduce the secondary side sensors from 9*3=27 voltage sensors to 0. In addition, control schemes in these examples allow reducing required current sensors at the secondaries from 9*3=27 current sensors to 0. They rely only on DC link voltage signals allowing AFE/FFE functionality to be implemented in a master or central controller with minimum modifications compared to diode front-end CHB drive versions.

Figure 2:
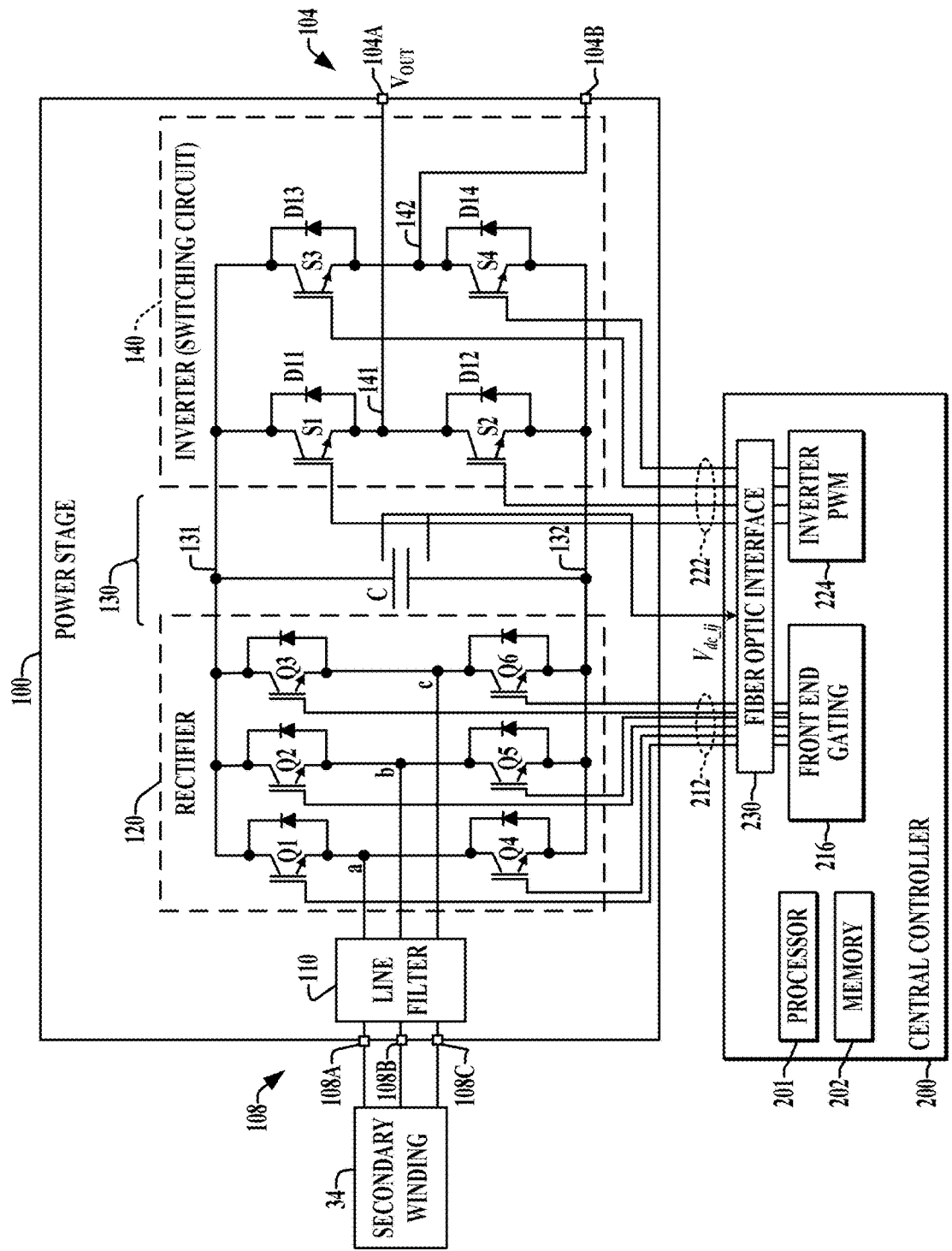
FIG. 2 is a schematic diagram of a power stage in the power conversion system of FIG. 1.

Referring initially to FIGS. 1 and 2, FIG. 1 illustrates an example multilevel inverter motor drive power conversion system 10 which includes a three-phase multilevel inverter 40 with series-connected power stages 100-1, 100-2 and 100-3 for each of three sections associated with the motor phases U, V and W of a motor load 50. Other embodiments are possible in which other forms of load 50 are driven, wherein the present disclosure is not limited to motor drive type power converters. In certain embodiments, the individual power stages 100 include an H-bridge switching circuit or inverter 140 with switching devices (e.g., S1-S4 in FIG. 2), although any suitable form of switching circuit 140 may be provided in the individual power stages 100 for generating a power stage output having one of two or more possible levels based on switching control signals 222 provided by an inverter control component 220 of a power converter controller 200.

The present disclosure provides advanced front end rectifier control apparatus and techniques which are hereinafter described in the context of the multilevel inverter motor drive power conversion system 10 and variations thereof. In other implementations, the disclosed rectifier controller and methods can be used in any active rectifier system, including a motor drive or other power conversion system including an active rectifier with or without an associated inverter. In one possible implementation, the disclosed apparatus and techniques can be used in association with a cascaded neutral point clamped (CNPC) power conversion system including a neutral point clamped inverter as H-bridge legs.

The example of FIG. 1 is a multiphase 7-level inverter 40 with N=3 power stages or power stages 100 for each of three motor load phases U, V and W (e.g., 100-U1, 100-2 and 100-U3 for phase U; 100-V1, 100-V2 and 100-V3 for phase V; and stages 100-W1, 100-W2 and 100-W3 for phase W). In other examples, the various aspects of the present disclosure may be implemented in association with single phase or multiphase, multilevel inverter type power conversion systems having any integer number "N" power stages 100 per output phase, where N is greater than one. In addition, although the illustrated embodiments utilize H-Bridge stages 100 cascaded to form multilevel inverters 40 for each phase of the motor drive system 10, other types and forms of power stages 100 can be used, such as a stage 100 with a switching circuit having more or less than four switching devices, wherein the broader aspects of the present disclosure are not limited to H-Bridge power stages or sub stages shown in the illustrated embodiments. For instance, embodiments are possible, in which the individual stages or substages may include as few as two switching devices or any integer number of switches greater than or equal to two.

As best seen in FIG. 1, the power converter 10 is supplied with multiphase AC input power from a phase shift transformer 30 having a multiphase primary circuit 32 (a delta configuration in the illustrated embodiment) receiving three-phase power from an AC power source 20. The transformer 30 includes nine three-phase secondary circuits 34, with three sets of three delta-configured three-phase secondary circuits 34, with each set being at a different phase relationship. Although the primary circuit 32 and the secondary circuits 34 are configured as delta windings in the illustrated example, "Y" connected primary windings and/or secondary windings can alternatively be used. In addition, while the transformer has respective three-phase primary and secondary circuits 32 and 34, other single or multiphase implementations can be used. In addition, the various secondary circuits 34 in the illustrated embodiments are phase shifted, although non-phase shifted embodiments are possible. Each of the three-phase secondary circuits 34 in the example of FIG. 1 is coupled to provide AC power to drive a three-phase rectifier 120 of a corresponding power stage 100 of the three-phase multilevel inverter 40. In one example, the power converter has no sensors associated with the secondary circuits 34 and may use one or more sensors 36T and 38T of a tertiary winding to generate one or more primary voltage and/or current signals of the primary circuit 32 or may directly sense one or more current and/or voltage feedback signals of the primary circuit 32 using one or more primary side sensors 36 and/or 38.

The converter 40 includes three multilevel phase circuits 42-U, 42-V and 42-W. The individual phase circuits 42 include three regenerative power stages 100 for 7-level output operation of each phase (e.g., power stages 100U-1 through 100U-3 for phase U, 100W-1 through 100W-3 for phase V, and 100W-1 through 100W-3 for phase W) with respective power stage outputs 104 connected in series. The inverter 40 is a 7-level inverter with three cascaded H-Bridge power stages 100U-1 through 100U-3 having outputs 104U-1 through 104U-3 connected in series with one another (cascaded) between a motor drive neutral point N and a first winding U of a three-phase motor load 50, and a similar configuration for the other motor phases V and W. Three power stages 100V-1 through 100V-3 provide series connected voltage outputs 104V-1 through 104V-3 between the neutral N and the second winding V, and three power stages 100W-1 through 100W-3 provide series connected voltage outputs 104W-1 through 104W-3 between the neutral N and the third winding W of the motor 50.

FIG. 2 illustrates one possible implementation of an H-Bridge power stage 100. The power stage in FIG. 2 is implemented as a power stage 100 including an AC input 108 with input terminals 108A, 108B and 108C connectable to receive AC input power, in this case three-phase power from an AC source such as a secondary circuit 34 of the transformer 30 in FIG. 1. The AC input power is provided from the terminals 108 to a rectifier circuit 120 having onboard rectifier switches Q1-Q6 forming a three-phase rectifier 120 which receives three-phase AC power from the corresponding transformer secondary circuit 34. The power stage 100 also includes a DC link circuit 130 and a switching circuit (e.g., inverter 140) providing an output voltage VOUT to a power stage output 104 having first and second output terminals 104A and 104B. In the illustrated embodiment, the rectifier 120 provides DC power across a DC capacitor C connected between DC link terminals 131 and 132 of the DC link circuit 130.

The DC link circuit 130, in turn, provides an input to an H-Bridge inverter 140 formed by four switching devices S1-S4 configured in an "H" bridge circuit. Any suitable switching circuit configuration can be used in the switching circuits 140 (e.g., inverter) of individual stages 100 having at least two switching devices S configured to selectively provide voltage at the stage output 104 of at least two distinct levels. Moreover, any suitable type of switching devices S may be used in the power stages 100, including without limitation semiconductor-based switches such as insulated gate bipolar transistors (IGBTs), silicon controlled rectifiers (SCRs), gate turn-off thyristors (GTOs), integrated gate commutated thyristors (IGCTs), etc.

The illustrated four-switch H-Bridge implementation allows selective switching control signal generation by the controller 200 to provide at least two distinct voltage levels at the output 104 in a controlled fashion. For instance, a voltage is provided at the output terminals 104A and 104B of a positive DC level substantially equal to the DC link voltage across the DC link capacitor C (e.g., +Vdc) when the switching devices S1 and S4 are turned on (conductive) while the other devices Q2 and Q3 are off (nonconductive). Conversely, a negative output is provided when S2 and S3 are turned on while S1 and S4 are off (e.g., −Vdc). Accordingly, the example H-Bridge power stage 100 allows selection of two different output voltages, and the cascaded configuration of three such stages (e.g., FIG. 1) allows selective switching control signal generation by the inverter control component 220 to implement 7 different voltage levels for application to the corresponding motor phase U, V or W.

Other possible switching circuitry may be used to implement a two, three, or K-level selectable output for individual stages 100, where K is any positive integer greater than 1. Any suitable logic or circuitry in the controller 200 can be used for providing inverter switching control signals 222 to a given power stage 100. The controller 200 may also include signal level amplification and/or driver circuitry (not shown) to provide suitable drive voltage and/or current levels sufficient to selectively actuate the switching devices S1-S4, for instance, such as comparators, carrier wave generators or digital logic and signal drivers.

The power converter controller 200 includes a processor 201, a memory 202, and a stage front end control component 210 that provides rectifier switching control signals 211 to a front end gating circuit or component 216, which in turn provides front end rectifier switching control signals 212 via a fiber optic interface 230 to operate the rectifier switching devices Q1-Q6 and to provide DC voltage feedback signals $V_{dc\_ij}$ to the front end controller 210. The controller 210 implements N×M instances of a front end controller 214 (e.g., U1 FE control, U2 FE control, U3 FE control, V1 FE control, V2 FE control, V3 FE control, W1 FE control, W2 FE control and W3 FE control), for example, via processor executable instructions stored in the memory 202 for execution by the processor 201.

The controller 200 also includes a first signal conditioning circuit 39 configured to receive one or more feedback signals (e.g., $v_{pri}$, $i_{pri}$) of the primary circuit 32. In one example the signal conditioning circuit 39 receives primary side feedback signals from three primary side current sensors 36 and three primary side voltage sensors 38. In another example, the signal conditioning circuit 39 receives primary side feedback signals from three secondary side current sensors 36T and three secondary side voltage sensors 38T operatively coupled with respective tertiary secondary windings that provide the feedback signals $v_{pri}$, $i_{pri}$ of the primary circuit 32. The first signal conditioning circuit 39 in one example includes isolation circuitry, amplifier circuits, and analog to digital conversion circuitry to provide sampled primary side voltage and current feedback signal $v_{pri}$, $i_{pri}$ of the primary circuit 32 during regenerative operation of the power conversion system 10.

The central controller 200 implements a synchronizer 218 (e.g., a CGSU), for example, via processor executable instructions stored in the memory 202 for execution by the processor 201. The synchronizer 218 generates M×N secondary angle signals $\theta_{grid\_ij}$ and M×N secondary voltage signals $v_{sec\_ij}$ based on the feedback signal $v_{pri}$, $i_{pri}$ of the primary circuit 32. The individual secondary angle signals $\theta_{grid\_ij}$ represent a phase angle of a corresponding one of the secondary circuits 34, and each secondary voltage signal $v_{sec\_ij}$ represents a voltage of the corresponding one of the secondary circuits 34, where the example index "i" is an integer that ranges from 1 to M representing the associated AC input phase from the associated 3-phase secondary circuit, and the example index "j" is an integer that ranges from 1 to N representing the set of secondary circuits 34 arranged in N=3 sets 35-1, 35-2 and 35-3 in FIG. 1.

In one example, the front end controller 210 includes or otherwise implements M×N front end controllers 214 individually associated with a corresponding one of the secondary circuits 34 and a corresponding one of the regenerative power stages 100. Each individual front end controller 214 in this example is configured to provide the rectifier switching control signals 212 to the corresponding one of the regenerative power stages 100 based on the secondary angle signal $\theta_{grid\_ij}$ representing the phase angle of the corresponding one of the secondary circuits 34 and on the secondary voltage signal $v_{sec\_ij}$ representing the voltage of the corresponding one of the secondary circuits 34.

The controller 200 also includes an inverter control component or inverter controller 220 (e.g., a motor controller) that provides control signals 222U to the power stages 100U-1 through 100U-3 associated with the first motor winding U. The inverter controller 220, and also provides control signals 222V to the power stages 100V-1 through 100V-3 and control signals 222W to the power stages 100W-1 through 100W-3. The controller 200 and its components 210, 220 can be implemented using any suitable hardware, processor executed software or firmware, or combinations thereof, wherein an exemplary embodiment of the controller 200 includes a processor 201 that can be one or more processing elements such as microprocessors, microcontrollers, DSPs, programmable logic, etc., along with electronic memory 202 that includes program and data storage, as well as signal conditioning and driver circuitry.

The processing element(s) are programmed or otherwise configured to generate signals 221 used to generate inverter switching control signals 222 via an inverter pulse width modulation (PWM) circuit or components 224 and the fiber optic interface 230. The inverter switching control signals 222 are suitable for operating the switching devices of the H-bridge inverter portions of the respective power stages 100. The central controller 200 in this example also includes a second signal conditioning circuit 56 configured to receive output or motor side feedback signals from three output current sensors 52 and three output voltage sensors 54. The second signal conditioning circuit 56 in one example includes isolation circuitry, amplifier circuits, and analog to digital conversion circuitry to provide sampled output voltage and current feedback signals of the motor 50 during motoring and regenerative operation of the power conversion system 10.

Described examples also include operating and manufacturing methods and non-transitory computer readable mediums (e.g., the memory 202) with computer executable program instructions which, when executed by a processor (e.g., processor 201), cause the processor to implement a method to control a multiphase multilevel regenerative power converter, such as the example converter 40 above with multilevel phase circuits 42 that individually include multiple power stages 100 with respective power stage outputs 104 connected in series.

FIG. 2 also schematically illustrates an example of one of the individual power stages 100, including an optional power stage filter 110, the active front and switching rectifier 120 (e.g., including rectifier switching devices S1-S6 connected as shown in FIG. 2 between a respective one of the secondary circuits 34 and a respective one of the first and second DC link nodes 131, 132), and the switching inverter 140 (e.g., including the inverter switching devices S1-S4 individually connected as shown in FIG. 2 between a respective one of the first and second DC link nodes 131, 132 and the respective power stage output 104).

The example multiphase multilevel regenerative power converter 40 shown in FIG. 1 includes three multilevel phase circuits 42, where the individual phase circuits 42 include multiple regenerative power stages 100 with respective power stage outputs 104 connected in series. As further shown in FIG. 2, the individual power stages 100 include an associated DC link circuit 130 with at least one capacitor C coupled between first and second DC link nodes 131 and 132, respectively. The individual power stages 100 also include a switching rectifier 120 with rectifier switching devices Q1-Q6 individually coupled between a respective one of the secondary circuits 34 and a respective one of the first and second DC link nodes 131 and 132, as well as a switching inverter 140 that includes an H-bridge formed by inverter switching devices S1-S4 individually coupled between a respective one of the first and second DC link nodes 131, 132 and the respective power stage output 104.

The use of the switching rectifier 120 facilitates motoring and regenerative operation of the system 10. The power stages 100 are provided for use as the power stages of single or multi-phase multilevel inverters 40. As shown in FIG. 2, the individual power stages 100 comprising a DC link circuit 130, a switching rectifier 120 coupled between a respective transformer secondary circuit 34 and the DC link circuit 130, and a switching inverter 140 coupled between the DC link circuit 130 and the respective power stage output 104.

The regenerative power conversion system 10 in FIG. 1 includes the phase shift transformer 30 having a primary circuit 32 and N secondary sets 35 of M secondary circuits 34, where N is an integer greater than 2 and M is an integer greater than 0. In certain implementations, M is greater than 2 (e.g., M=3 in the example of FIG. 1). The secondary circuits 34 of individual secondary sets 35 are in phase with one another, and the secondary circuits 34 of different secondary sets 35 are out of phase with one another. In this example, the individual phase circuits 42 have N=3 regenerative power stages 100.

As best shown in FIG. 2, the individual regenerative power stages 100 comprise a line filter, a switching rectifier 120, a DC link circuit 130, a switching inverter 140 and the associated power stage output 104. The DC link circuit 130 includes at least one capacitor C coupled between the first and second DC link nodes 131, 132, and the switching rectifier 120 includes rectifier switching devices Q1-Q6 individually coupled between a respective one of the secondary circuits 34 and a respective one of the first and second DC link nodes 131, 132. The switching inverter 140 includes the inverter switching devices S1-S4 individually coupled between a respective one of the first and second DC link nodes 131, 132 and the power stage output 104. The switching rectifiers 120 of the N multiple regenerative power stages 100 of each phase circuit 42 are coupled to a respective one of the secondary circuits 34 of a respective one of the N secondary sets, and the power stage outputs 104 of the N multiple regenerative power stages 100 of each phase circuit 42 connected in series.

The controller 200 is a central controller that implements both motoring and regenerative operation of the power conversion system 10, for example, by the processor 201 executing instructions stored in the memory 202. The controller 200 is configured to synchronize rectifier switching control signals 212 provided to the rectifier switching devices Q1-Q6 of each regenerative power stage 100 to a phase angle of a corresponding one of the secondary circuit 34 based on one or both of the feedback signals $v_{pri}$ and/or $i_{pri}$ of the primary circuit 32 during regenerative operation of the power conversion system 10.

Figure 3:
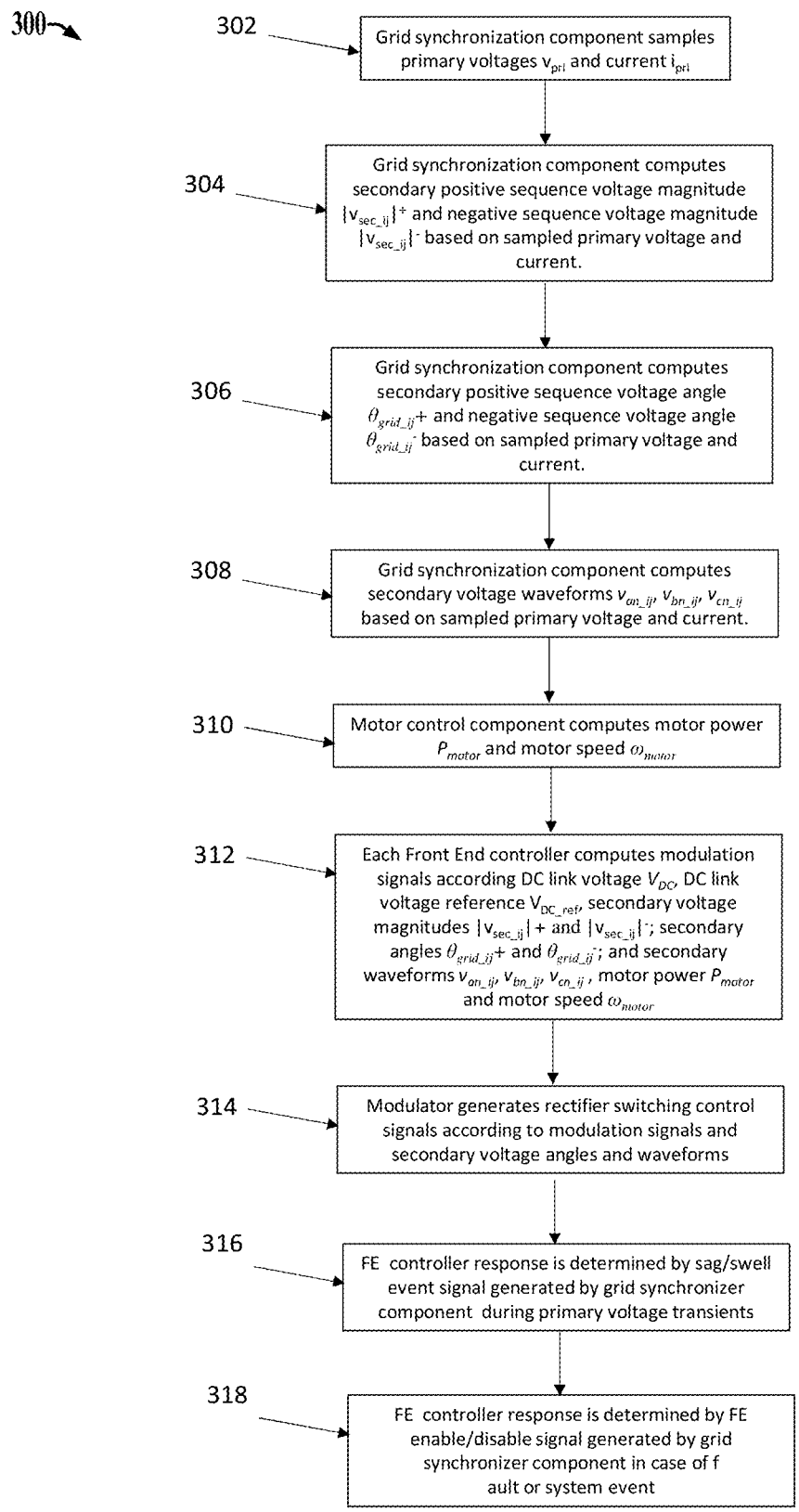
FIG. 3 is a flow diagram.
Figure 4:
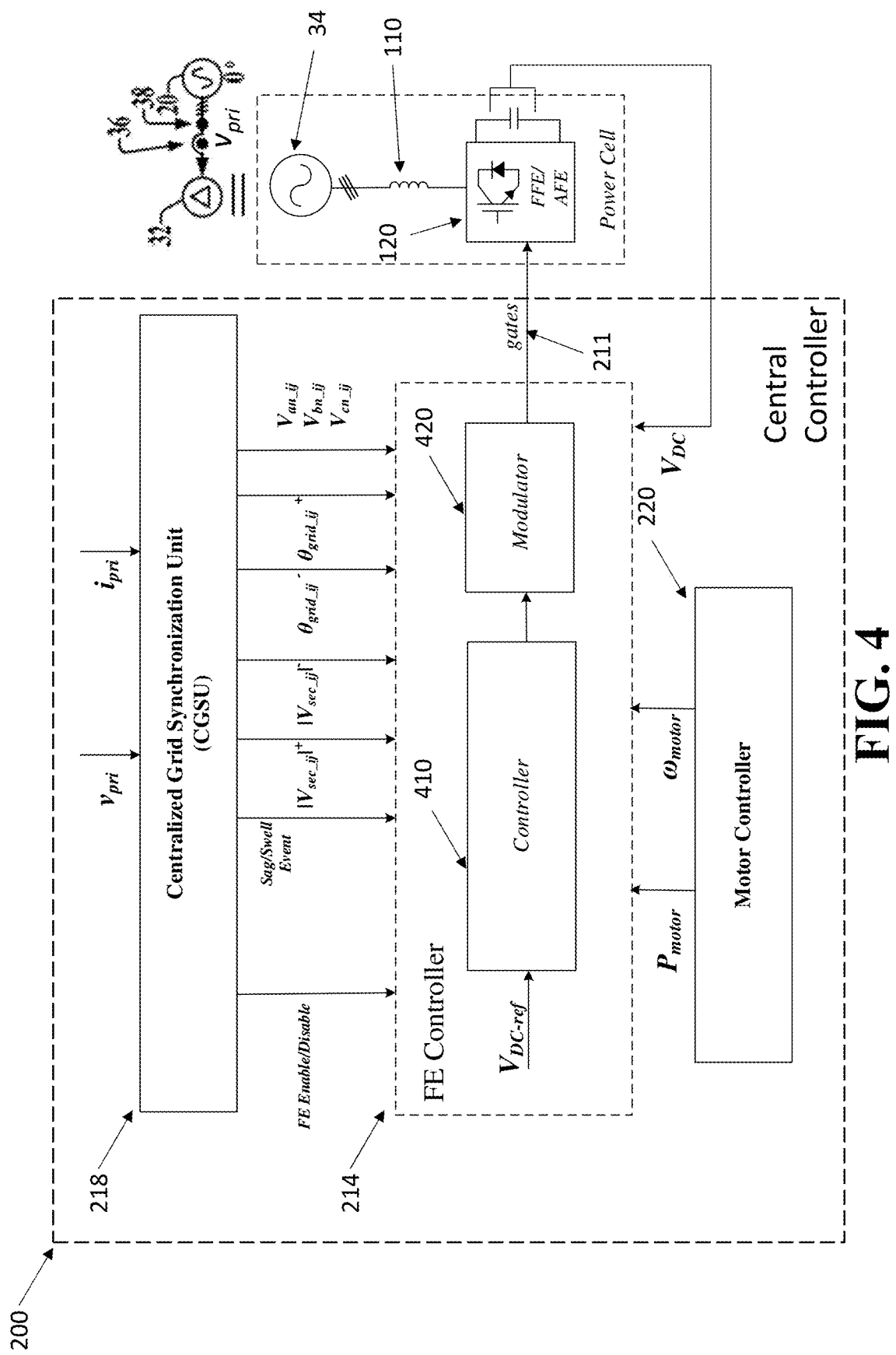
FIG. 4 is a schematic diagram of a front end control instance for a corresponding power stage in the power conversion system of FIG. 1.

Referring to FIGS. 3 and 4, FIG. 3 shows a method 300. In one example, the memory 202 of the central controller 200 is a non-transitory computer readable medium 202 that stores computer executable instructions, which, when executed by a processor 201, cause the processor 201 to implement the method 300 during powered operation of the power conversion system 10. FIG. 4 shows a front end control instance for a corresponding power stage in the power conversion system of FIG. 1, in which the individual front end control instances 214 have a controller 410 and a modulator 420. As shown in FIG. 4, the supply 20 at the primary circuit 32 has a grid voltage $v_{pri}$ at a grid angle of 0 degrees, and the corresponding secondary circuit 34 provides the three phase AC input to the active rectifier 120.

In one example, the computer executable instructions stored in the memory 202, when executed by the processor 201, cause the processor 201 to sample a feedback signal at 302 (e.g., $v_{pri}$, $i_{pri}$) of the primary circuit 32 of the phase shift transformer 30, for example, using the first signal conditioning circuit 39 and the sensors 36 and 38 of FIG. 1 above. The computer executable instructions stored in the memory 202, when executed by the processor 201, cause the processor 201 to synchronize the rectifier switching control signals 212 provided to rectifier switching devices Q1-Q6 of each regenerative power stage 100 coupled to a respective secondary circuit 34 of the phase shift transformer 30, to a phase angle of the respective secondary circuit 34 based on the feedback signal $v_{pri}$, $i_{pri}$, of the primary circuit 32 during regenerative operation of a power conversion system 10 at 304-312 in FIG. 3.

In one example, at 304, the computer executable instructions stored in the memory 202, when executed by the processor 201, cause the processor 201 to implement the synchronizer 218 to generate M×N secondary voltage magnitude signals $|V_{sec\_ij}|^+$ (positive sequence) and $|V_{sec\_ij}|^-$ (negative sequence) based on the feedback signal or signals (e.g., $v_{pri}$, $i_{pri}$) of the primary circuit 32, where each secondary voltage magnitude signal pair represents the positive and negative sequence voltage components of the corresponding one of the secondary circuits 34. At 306 in this example, the computer executable instructions stored in the memory 202, when executed by the processor 201, cause the processor 201 to implement the synchronizer 218 to generate the M×N secondary angle signals $\theta_{grid,ij}^+$ (positive sequence) and $\theta_{grid\_ij}^+$ (negative sequence) based on the feedback signal (e.g., $v_{pri}$, $i_{pri}$) of the primary circuit 32, where each individual secondary angle signal pair represents the positive and negative sequence phase angles of the corresponding one of the secondary circuits 34. At 308 in this example, the computer executable instructions stored in the memory 202, when executed by the processor 201, cause the processor 201 to implement the synchronizer 218 to generate the M×N secondary voltage waveform signals $V_{an\_ij}$, $V_{bn\_ij}$, $V_{cn\_ij}$ of the corresponding one of the secondary circuits 34, based on the feedback signal (e.g., $v_{pri}$, $i_{pri}$) of the primary circuit 32, where each set of three phase secondary voltage waveform signals represents the three phase voltages of the corresponding one of the secondary circuits 34. Signals $\theta_{grid\_ij}^+$, $\theta_{grid\_ij}^-$, $|V_{sec\_ij}|^+$, $|V_{sec\_ij}|^-$, $V_{an\_ij}$, $V_{bn\_ij}$, $V_{cn\_ij}$ need not be used simultaneously. The front end controller may only rely on a subset of these signals based on the control implementation to achieve its control objections.

At 310 in this example, the computer executable instructions stored in the memory 202, when executed by the processor 201, cause the processor 201 to implement the motor controller 220 to provide a motor power $P_{motor}$ and a motor speed $\omega_{motor}$ to the controller 410. At 312, the computer executable instructions stored in the memory 202, when executed by the processor 201, cause the processor 201 to implement the modulator 420 to compute one or more modulation signals according to DC link voltage VDC, reference DC link voltage ($V_{DC\text{-}ref}$), the secondary voltage magnitude signals $|V_{sec\_ij}|^+$, $|V_{sec\_ij}|^-$, the secondary voltage angle signals $\theta_{grid\_ij}^+$, $\theta_{grid\_ij}^-$, the secondary voltage waveform $V_{an\_ij}$, $V_{bn\_ij}$, $V_{cn\_ij}$, the desired motor power $P_{motor}$ and the motor speed $\omega_{motor}$, and other inputs to the FE controller instance 214 as shown in FIG. 4. At 314, the computer executable instructions stored in the memory 202, when executed by the processor 201, cause the processor 201 to provide the rectifier switching control signals 212 to the corresponding regenerative power stages 100 based on the secondary angle signal $\theta_{grid\_ij}^+$ (positive sequence) and $\theta_{grid\_ij}^-$ (negative sequence) representing the phase angle of the corresponding one of the secondary circuits 34 and on the secondary voltage waveform signal waveform signals $V_{an\_ij}$, $V_{bn\_ij}$, $V_{cn\_ij}$ representing the voltage waveforms of the corresponding one of the secondary circuits 34. At 316 in this example, the computer executable instructions stored in the memory 202, when executed by the processor 201, cause the processor 201 to generate sag/swell event signal in grid synchronizer 218 based on primary voltage signal $v_{pri}$. This signal determines the front end controller response during primary voltage transients. At 318, the computer executable instructions stored in the memory 202, when executed by the processor 201, cause the processor 201 to generate FE enable/disable signal in grid synchronizer 218 based on a fault conditions or a system events. This signal either enable or disable the whole FE controller.

Figure 5:
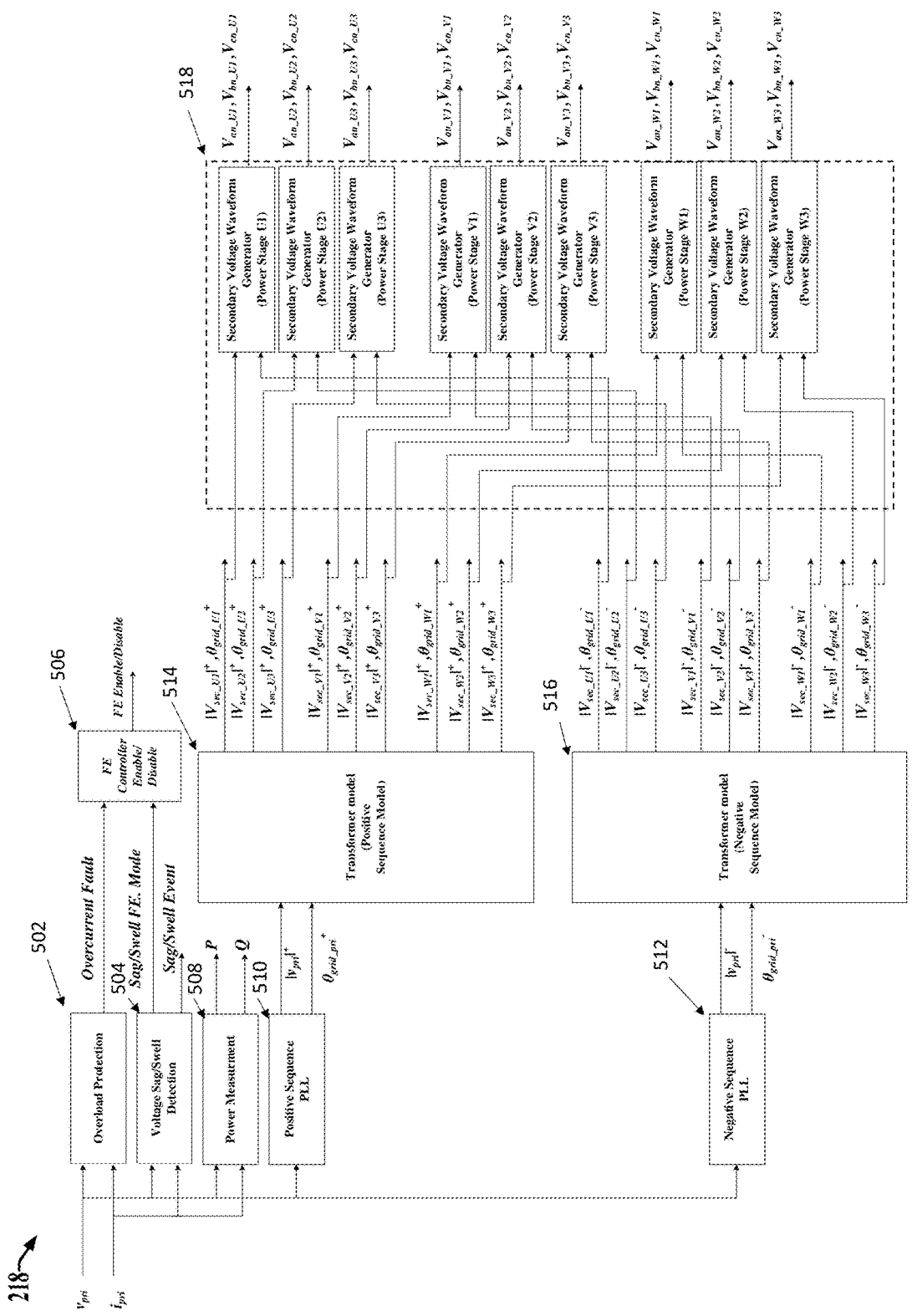
FIG. 5 is a schematic diagram of one example of the synchronizer of the controller in the power conversion system of FIG. 1.

FIG. 5 shows an example synchronizer 218 of the central controller 200, implemented at least in part by computer executable instructions stored in the memory 202, and executed by the processor 201 in operation of the power conversion system 10. The synchronizer 218 in this example has an overload protection component or circuit 502, a voltage sag/swell detection component or circuit 504, a front end controller enable/disable logic component or circuit 506, a power measurement component or circuit 508, a positive sequence PLL 510, a negative sequence PLL 512, a positive sequence transformer angle model 514, a negative sequence transformer model 516, and additional M×N secondary voltage waveform signals 518 if required. The synchronizer 218 receives the voltage and current feedback signals $v_{pri}$ and $i_{pri}$ of the primary circuit 32, and the overload protection component or circuit 502 selectively provides an overcurrent fault signal based on the feedback signals $v_{pri}$ and $i_{pri}$. The voltage sag/swell detection component or circuit 504 selectively provides a sag/swell event signal and sag/swell FE mode signal based on the feedback signals $v_{pri}$ and $i_{pri}$. The front end controller enable/disable component or circuit 506 provides a FE enable/disable signal based on overcurrent fault signal generated from 502 or sag/swell FE mode signal generated from 504. a front end controller enable/disable logic component or circuit 506, The power measurement component or circuit 508 provides P and Q power output signals based on the feedback signals $v_{pri}$ and $i_{pri}$. The positive sequence PLL 510 provides the primary positive sequence phase angle signal $\theta_{grid\_pri}^+$ representing a positive sequence phase angle of the primary circuit 32 and magnitude of the primary positive sequence voltage $|v_{pri}|^+$ based on the primary voltage feedback signal $v_{pri}$ of the primary circuit 32. The negative sequence PLL 512 provides the primary negative sequence phase angle signal $\theta_{grid\_pri}^-$ representing a negative sequence phase angle of the primary circuit 32 and magnitude of the negative sequence primary voltage $|v_{pri}|^-$ based on the primary voltage feedback signal $v_{pri}$ of the primary circuit 32.

The positive sequence transformer model 514 models the positive sequence angle relationship of phase shift transformer 30 and provides secondary winding positive sequence voltage magnitude signals $|V_{sec\_ij}|^+$ and secondary positive sequence angle signals $\theta_{grid\_ij}^+$ for individual ones of the nine front end controllers 214. The negative sequence transformer model 516 models the negative sequence angle relationship of phase shift transformer 30 and provides secondary winding negative sequence voltage magnitude signals $|V_{sec\_ij}|^-$ and secondary negative sequence angle signals $\theta_{grid\_ij}^-$ for individual ones of the nine front end controllers 214. The M×N secondary voltage waveform signals 518 generate secondary voltage waveforms signals $V_{an\_ij}, V_{bn\_ij}, V_{cn\_ij}$ of the corresponding one of the secondary circuits 34, based on the outputs of the positive sequence transformer model 514 and negative sequence transformer model 516 through the methodology shown in FIG. 5. This implementation provides signals (e.g., electrical voltages, digital values, etc.) with one or more of the components 502-518 implemented as processor executed computer readable instructions, and facilitates the use of positive sequence PLL 510 and a negative sequence PLL 512 in combination with the positive sequence and negative transformer models 514 and 516 to facilitate the central controller 200 implementing centralized primary voltage and current measurements for: overload protection, voltage sag/swell detection, power measurement and grid synchronization for regeneration mode operation of the power stages 100, where a positive sequence PLL 508 and a negative sequence PLL 512 provides centralized calculation of primary voltage magnitude, frequency, and angle.

Figure 6:
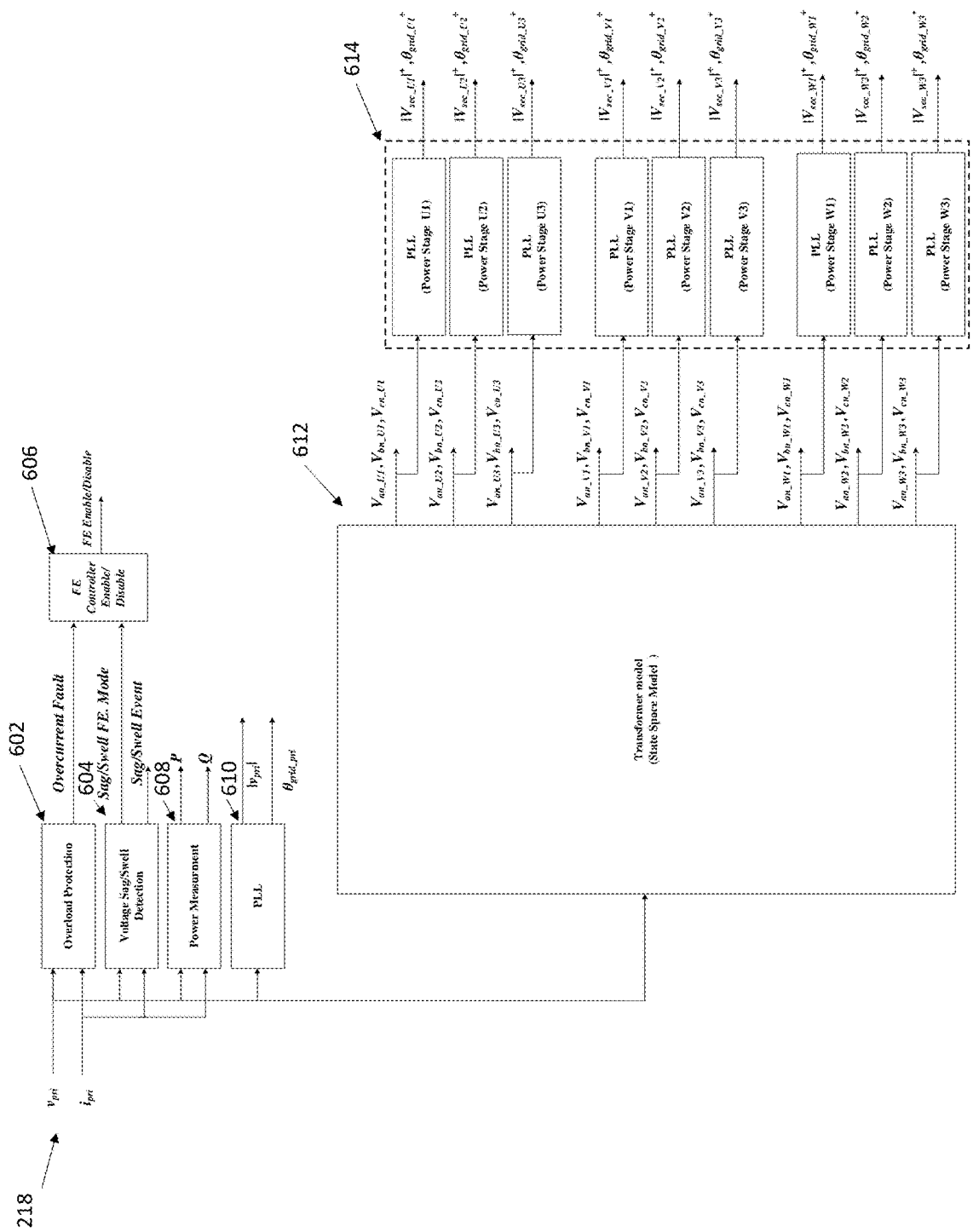
FIG. 6 is a schematic diagram of another example of the synchronizer of the controller in the power conversion system of FIG. 1.

FIG. 6 shows another example synchronizer 218 of the central controller 200, implemented at least in part by computer executable instructions stored in the memory 202, and executed by the processor 201 in operation of the power conversion system 10. The synchronizer 218 in this example has an overload protection component or circuit 602, a voltage sag/swell detection component or circuit 604, a power measurement component or circuit 608, a transformer circuit state space model 610, and additional M×N positive sequence PLLs 612 if required. The synchronizer 218 receives the voltage and current feedback signals $v_{pri}$ and $i_{pri}$ of the primary circuit 32, and the overload protection component or circuit 602 selectively provides an overcurrent event signal based on the feedback signals $v_{pri}$ and $i_{pri}$. The voltage sag/swell detection component or circuit 604 selectively provides a sag/swell event signal and sag/swell FE mode based on the feedback signals $v_{pri}$ and $i_{pri}$. The front end controller enable/disable component or circuit 606 provides a FE enable/disable signal based on overcurrent fault signal generated from 602 or sag/swell FE mode signal generated from 604. The power measurement component or circuit 608 provides P and Q power output signals based on the feedback signals $v_{pri}$ and $i_{pri}$. Based on $v_{pri}$ waveform signal, the transformer circuit model 610 computes the secondary voltage waveforms signals $V_{an\_ij}, V_{bn\_ij}, V_{cn\_ij}$ of the corresponding one of the secondary circuits 34. The M×N positive sequence PLLs 612 provides the secondary positive sequence phase angle signal $\theta_{grid\_ij}^+$ representing positive sequence phase angle and the magnitude of the secondary positive sequence voltage $|V_{sec\_ij}|^+$ based on the corresponding $V_{an\_ij}, V_{bn\_ij}, V_{cn\_ij}$ of the corresponding one of the secondary.

Figure 7:
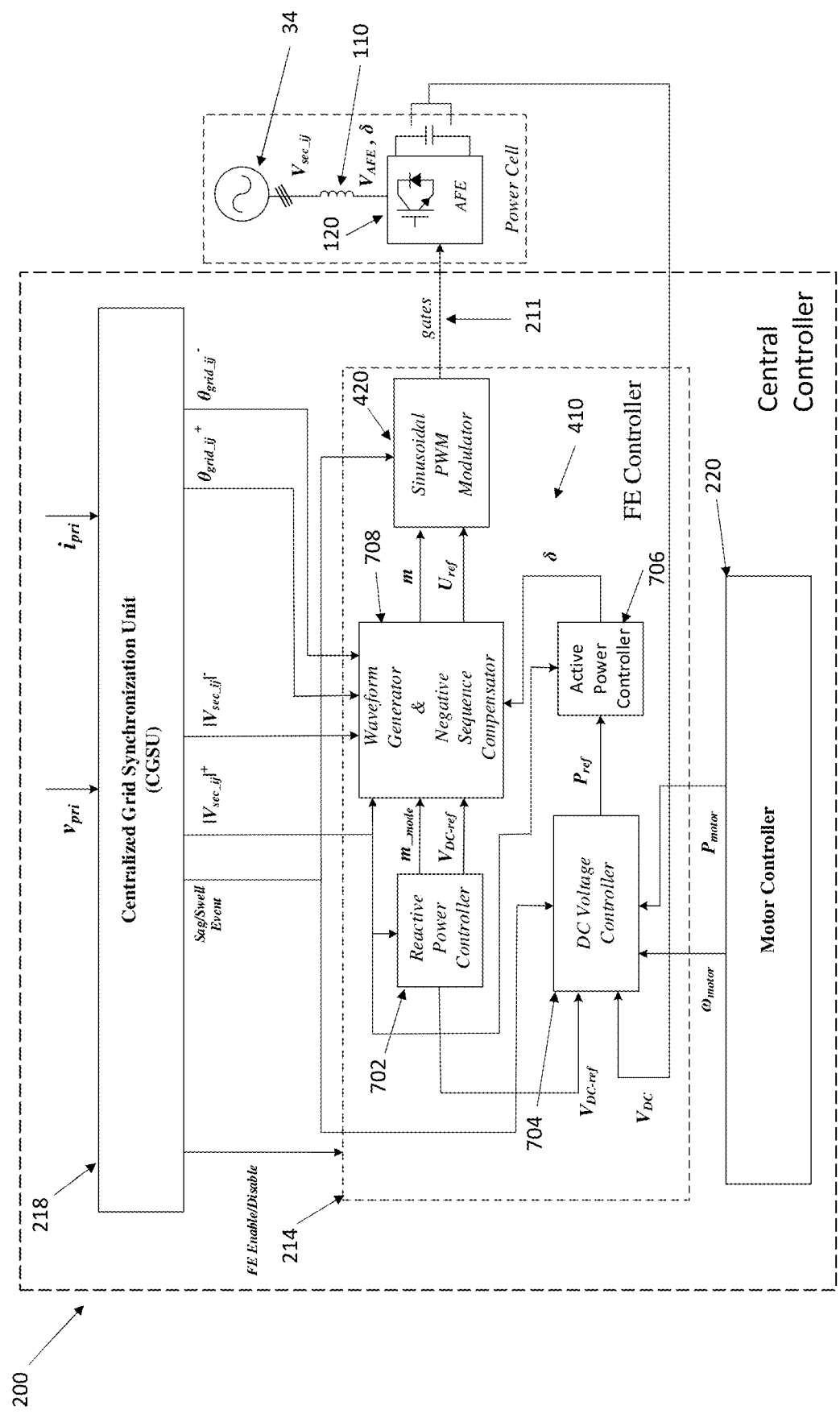
FIG. 7 is a schematic diagram of an example of AFE front end control instance for a corresponding power stage in the power conversion system of FIG. 1.

FIG. 7 shows an example front end control instance 214 for a corresponding power stage 100 in the power conversion system 10 of FIG. 1. In this example, the individual front end controllers 214 include a reactive power controller 702, a DC link voltage controller 704, an active power controller 706, a voltage waveform generator and a negative sequence compensator 708, and the sinusoidal PWM AFE modulator 420. The reactive power controller 702 provides a modulation index mode signal $m_{mode}$ and DC voltage reference $V_{DC\_ref}$ based on the secondary positive sequence voltage magnitude signal $|V_{sec\_ij}|^+$ corresponding to the respective front end controller 214. The DC link voltage controller 704 provides a power reference signal $P_{ref}$ based on a DC voltage error signal and a motor power $P_{motor}$. DC link voltage controller may use $\omega_{motor}$ information for DC link voltage filtration. The active power controller 706 provides a power angle signal $\delta$ based on the power reference signal $P_{ref}$ and the secondary positive sequence voltage magnitude signal $|V_{sec\_ij}|^+$ corresponding to the respective front end controller 214. The voltage waveform generator and a negative sequence compensator 708 takes $\theta_{grid\_ij}^+$, $\theta_{grid\_ij}^-$, $|V_{sec\_ij}|^+$, $|V_{sec\_ij}|^-$, $\delta$, $V_{DC\_ref}$ as inputs and produces modulation index signal m and per unit reference waveform $U_{ref}$. The modulator 420 provides the rectifier switching control signals 212 to the corresponding one of the regenerative power stages 100 based on the modulation index m, and per unit reference waveform $U_{ref}$. The generated sag/swell event signal in grid synchronizer 218 based on primary voltage signal $v_{pri}$, determines AFE controller response during primary voltage transients. The generated FE enable/disable signal in grid synchronizer 218 based on a fault conditions or a system events, enables or disables the whole AFE controller.

In this example, the central controller 200 provides AFE motoring and regeneration with DC link voltage regulation, reactive power compensation (during nominal conditions; input voltage unbalance; symmetric/asymmetric voltage sags), and sinusoidal PWM modulation. In operation, the DC link voltage controller 704 main task is to set the reference active power ($P_{ref}$) based on the error between the reference DC link voltage ($V_{DC\text{-}ref}$) and the measured DC link voltage ($V_{DC}$). Feedforward signal of $P_{motor}$ is used by DC link voltage controller 704 to help in DC link voltage disturbance rejection and to reduce current overshoots. Another important task implemented in the DC link voltage controller is the FE input voltage transient compensation. This function is activated during input voltage transient meanwhile the main function of the DC link voltage controller is disabled. The active power controller 706 controls the active power flow between the AFE 120 and the secondary of the transformer by setting the power angle $\delta$, which is the angle of the AFE output voltage with respect to the estimated secondary voltage from the synchronizer 218. The active power controller 706 uses feedforward of the secondary positive sequence voltage magnitude signal of $|V_{sec\_ij}|^+$ to compensate for voltage sag/swell events, where the power change $\Delta P \approx f(|V_{sec\_ij}|^+)*\Delta\delta$.

Figure 8:
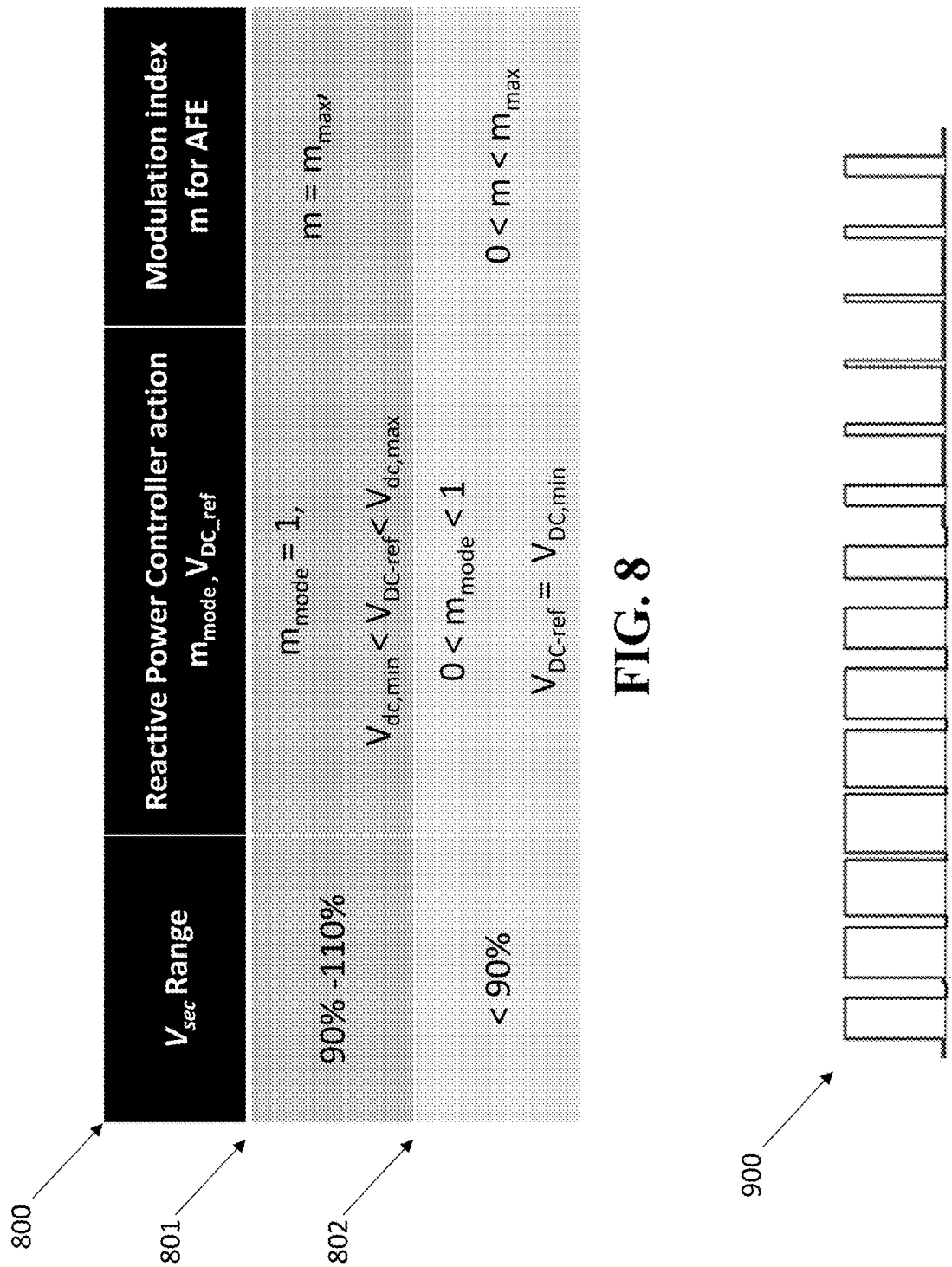
FIG. 8 is a table of modulation index and dc link voltage control in one example of the front end control instance of FIG. 7.

FIG. 8 shows a table 800 of modulation index mode signal $m_{mode}$ and dc link voltage control in one example of the front end control instance 214 of FIG. 7. In this example, at 801 in response to the secondary positive sequence voltage magnitude signal $|V_{sec\_ij}|$+ corresponding to the respective front end controller 214 being greater than or equal to a threshold TH, the reactive power controller 702 provides the modulation index mode signal $m_{mode}$ having a value of 1. This sets the voltage waveform generator and negative sequence compensator 708 to force the modulation index m having a value of $m_{max}$ and the front end controller 214 controls the DC voltage reference VDC ref between a first value VDC, min and a second value $V_{DC,\ max}$. At 802, in response to the secondary positive sequence voltage magnitude signal $|V_{sec\_ij}|^+$ corresponding to the respective front end controller 214 being less than the threshold TH, the reactive power controller 702 provides the modulation index mode signal $m_{mode}$ having a value between 0 and 1. This sets the voltage waveform generator and negative sequence compensator 708 to allow the modulation index m having a value between 0 and $m_{max}$ and the front end controller 214 controls the DC voltage reference $V_{DC\_ref}$ at the first value $V_{DC, min}$.

These implementations provide reactive power compensation that minimizes reactive power flow in the secondary windings of the secondary circuit 34. In operation, reactive power controller 702 provides closed loop regulation that minimizes the difference between $V_{sec\_ij}$ and $V_{AFE}$ magnitudes, where the reactive power $\Delta Q \approx V_{sec\_ij} - V_{AFE}$. The reactive power controller 702 controls the magnitude of $V_{AFE}$ by controlling the DC link voltage reference ($V_{DC-ref}$) and/or the modulation index mode signal $m_{mode}$, where $V_{AFE} \approx f$ ($m_{mode} * V_{DC\_ref}$). In one implementation, the threshold TH is fixed (e.g., 90% as shown in the tables 800). In another implementation, the controller 200 changes the threshold TH according to specific design parameters for a given system, such as based on the nominal or rated secondary voltage.

Figure 9:
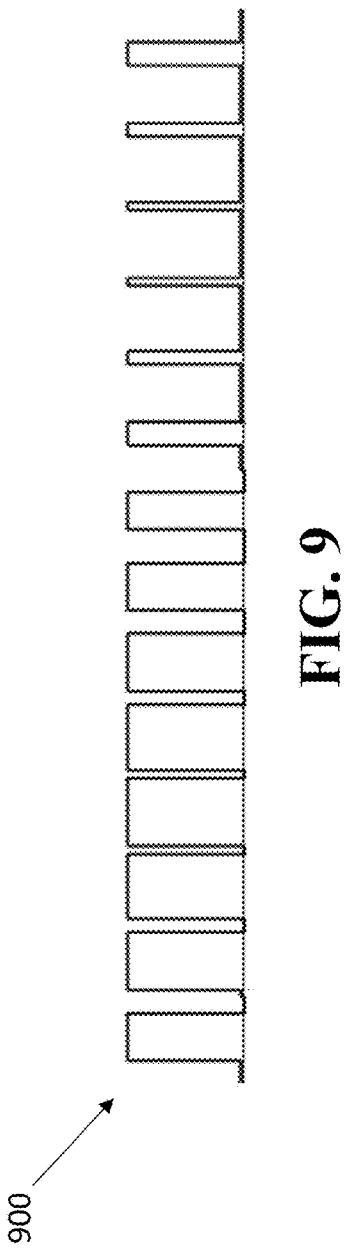
FIG. 9 is an example front end rectifier switching control signal in one example of the front end control instance of FIG. 7.

FIG. 9 shows a signal diagram 900 illustrating an example front end rectifier switching control signal for sinusoidal PWM AFE operation with the switching frequency $f_{sw}$. The modulator 420 selectively controls the gating of the power stage rectifier switches Q1-Q6 according to the computed modulation index m and per unit reference waveform $U_{ref}$.

Figure 10:
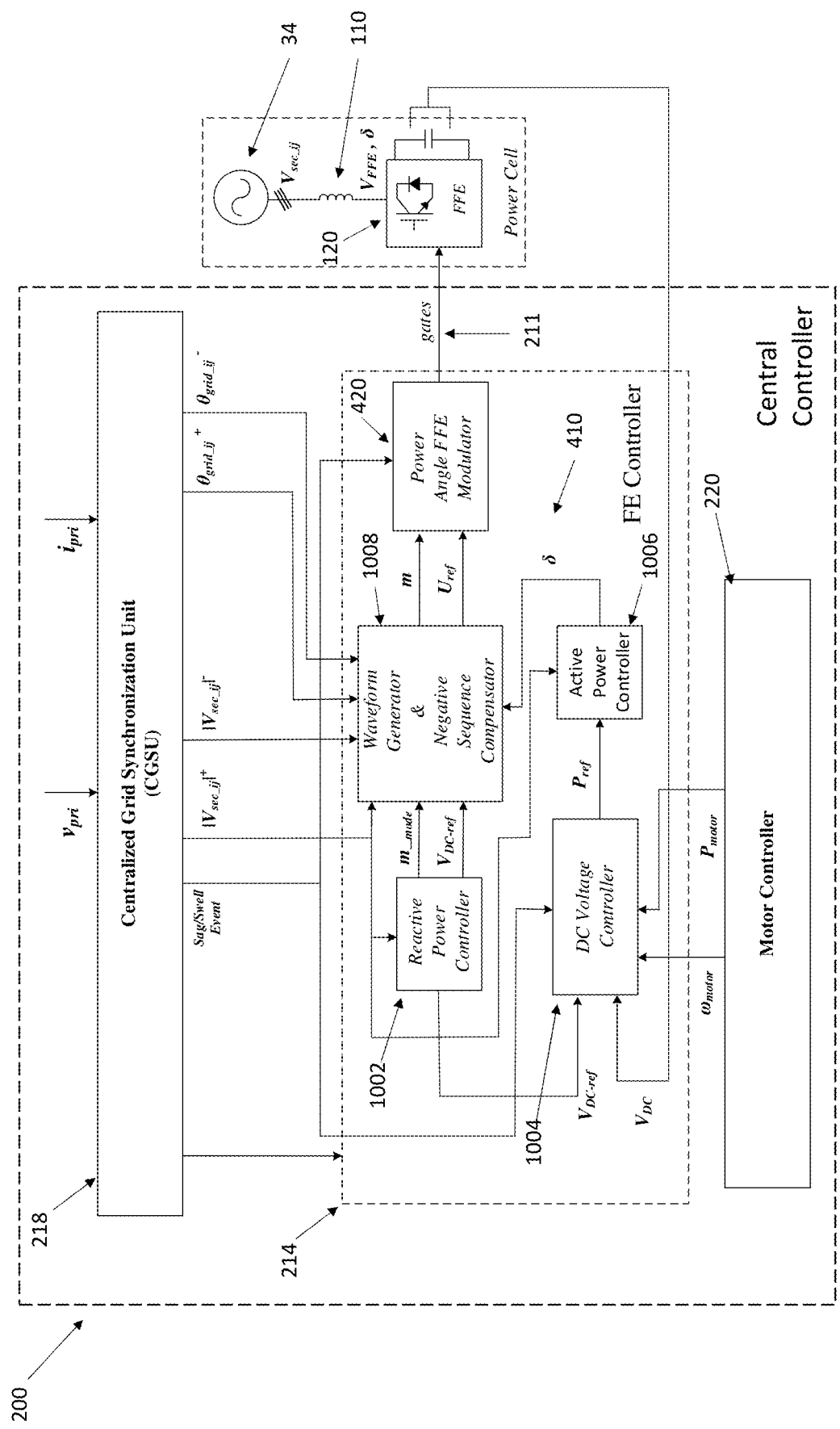
FIG. 10 is a schematic diagram of an example of FFE front end control instance for a corresponding power stage in the power conversion system of FIG. 1.

FIG. 10 shows an example front end control instance 214 for a corresponding power stage 100 in the power conversion system 10 of FIG. 1. In this example, the individual front end controllers 214 include a reactive power controller 1002, a DC link voltage controller 1004, an active power controller 1006, a voltage waveform generator and negative sequence compensator 1008, and the power angle FFE modulator 420. The reactive power controller 1002 provides a modulation index mode signal $m_{mode}$ and DC voltage reference $V_{DC\_ref}$ based on the secondary positive sequence voltage magnitude signal $|V_{sec\_ij}|^+$ corresponding to the respective front end controller 214. The DC link voltage controller 1004 provides a power reference signal $P_{ref}$ based on a DC voltage error signal and a motor power $P_{motor}$. DC link voltage controller may use $\omega_{motor}$ information for DC link voltage filtration. The active power controller 1006 provides a power angle signal $\delta$ based on the power reference signal $P_{ref}$ and the secondary positive sequence voltage magnitude signal $|V_{sec\_ij}|^+$ corresponding to the respective front end controller 214. The voltage waveform generator and negative sequence compensator 1008 takes $\theta_{grid\_ij}^+$, $\theta_{grid\_ij}^-$, $|V_{sec\_ij}|^+$, $|V_{sec\_ij}|^-$, $\delta$, $V_{DCc\_ref}$ as inputs and produces modulation signal m and per unit reference waveform $U_{ref}$. The modulator 420 provides the rectifier switching control signals 212 to the corresponding one of the regenerative power stages 100 based on the modulation index m, and per unit reference waveform $U_{ref}$. The generated sag/swell event signal in grid synchronizer 218 based on primary voltage signal $v_{pri}$, determines FFE controller response during primary voltage transients. The generated FE enable/disable signal in grid synchronizer 218 based on a fault conditions or a system events, enables or disables the whole FFE controller.

In this example, the central controller 200 provides fundamental front end FFE motoring and regeneration with DC link voltage regulation, reactive power compensation (during nominal conditions; input voltage unbalance; symmetric/asymmetric voltage sags), and power angle FFE modulation. In operation, the DC link voltage controller 1004 main task is to set the reference active power ($P_{ref}$) based on the error between the reference DC link voltage ($V_{DC-ref}$) and the measured DC link voltage ($V_{DC}$). Feedforward signal of $P_{motor}$ is used by DC link voltage controller 1004 to help in DC link voltage disturbance rejection and to reduce current overshoots. Another important task implemented in the DC link voltage controller is the FE input voltage transient compensation. This function is activated in during transient meanwhile the main function of the DC link voltage controller is disabled. The active power controller 1006 controls the active power flow between the FFE 120 and the secondary of the transformer by setting the power angle $\delta$, which is the angle of the FFE output voltage with respect to the estimated secondary voltage from the synchronizer 218. The active power controller 1006 uses feedforward of the secondary positive sequence voltage magnitude signal of $|V_{sec\_ij}|^+$ to compensate for voltage sag/swell events, where the power change $\Delta P \approx f(|V_{sec\_ij}|^+)^* \Delta \delta$.

Figure 11:
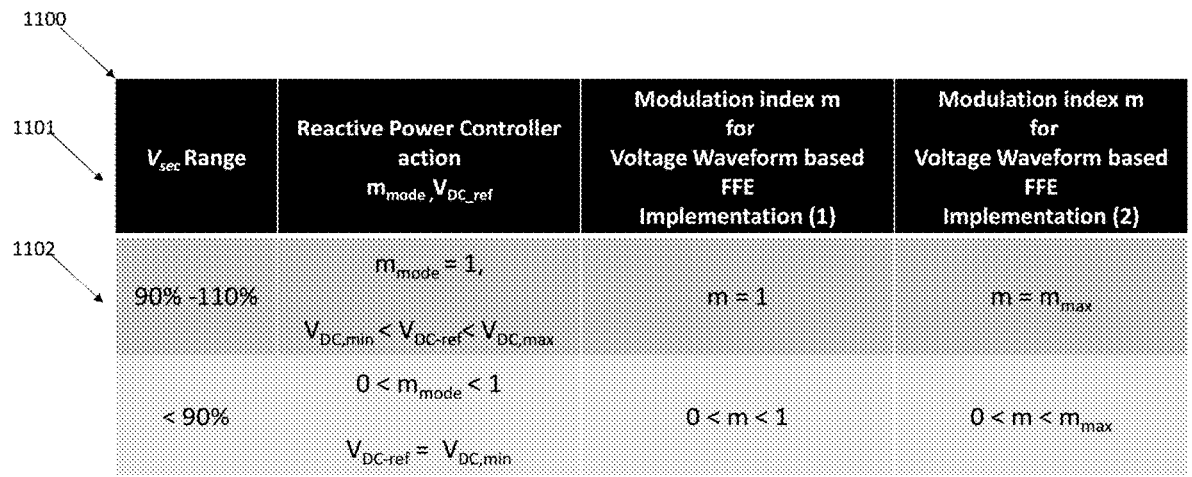
FIG. 11 is a table of modulation index and dc link voltage control in one example of the front end control instance of FIG. 10.

FIG. 11 shows a table 1100 of modulation index mode signal $m_{mode}$ and DC link voltage control in one example of the front end control instance 214 of FIG. 10. In this example, at 1101 in response to the secondary positive sequence voltage magnitude signal $|V_{sec\_ij}|^+$ corresponding to the respective front end controller 214 being greater than or equal to a threshold TH, the reactive power controller 1002 provides the modulation index mode signal $m_{mode}$ having a value of 1. This sets the voltage waveform generator and a negative sequence compensator 1008 to force the modulation index m having a value 1 in one implementation or $m_{max}$ in another implementation and the front end controller 214 controls the DC voltage reference $V_{DC\_ref}$ between a first value VDC, mm and a second value $V_{DC, max}$. At 1102, in response to the secondary positive sequence voltage magnitude signal $|V_{sec\_ij}|^+$ corresponding to the respective front end controller 214 being less than the threshold TH, the reactive power controller 1002 provides the modulation index mode signal $m_{mode}$ having a value between 0 and 1. This sets the voltage waveform generator and negative sequence compensator 1008 to allow the modulation index m having a value between 0 to 1 in one implementation or $m_{max}$ in another implementation and the front end controller 214 controls the DC voltage reference $V_{DC\_ref}$ at the first value $V_{DC, min}$.

These implementations provide reactive power compensation that minimizes reactive power flow in the secondary windings of the secondary circuit 34. In operation, reactive power controller 1002 provides closed loop regulation that minimizes the difference between $V_{sec\_ij}$ and $V_{FFE}$ magnitudes, where the reactive power $\Delta Q \approx V_{sec\_ij} - V_{FFE}$. The reactive power controller 1002 controls the magnitude of $V_{FFE}$ by controlling the DC link voltage reference ($V_{DC-ref}$) and/or the modulation index mode signal $m_{mode}$, where $V_{FFE} \approx f(m_{mode} * V_{DC\_ref})$. In one implementation, the threshold TH is fixed (e.g., 90% as shown in the tables 1100). In another implementation, the controller 200 changes the threshold TH according to specific design parameters for a given system, such as based on the nominal or rated secondary voltage.

Figure 12:
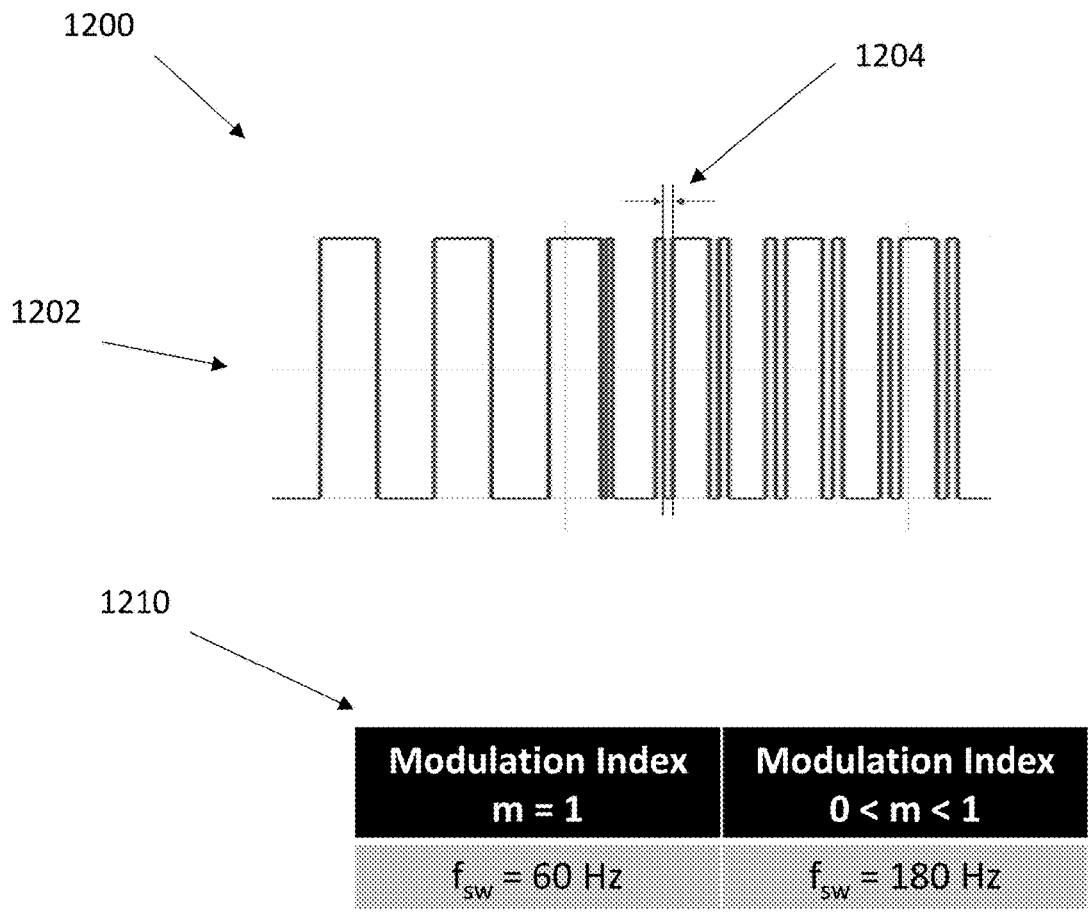
FIG. 12 is an example front end rectifier switching control signal in one example of the front end control instance of FIG. 10.

FIG. 12 shows a signal diagram 1200 with a curve 1202 illustrating an example front end rectifier switching control signal for fundamental front end (FFE) operation with the switching frequency equal to the line frequency (e.g., 60 Hz). The modulator 420 selectively controls a delay angle 1204 ($\alpha$) in the gating of the power stage rectifier switches Q1-Q6 according to the computed modulation index m. On the left in FIG. 12, at a unity modulation index (m=1), each switch conducts for 180 degrees, where the switching frequency is 60 Hz in this example. Continuing to the right in FIG. 12, for m<1, each switch is driven by a quasi-square wave gating signal with a delay angle α, which results in a net switching frequency of 180 Hz, due to three switching events per cycle, where $$|V_{FFE}| = \frac{2V_{dc}}{\pi}(2m-1),$$

and the modulation index m=cos α.

Figure 13:
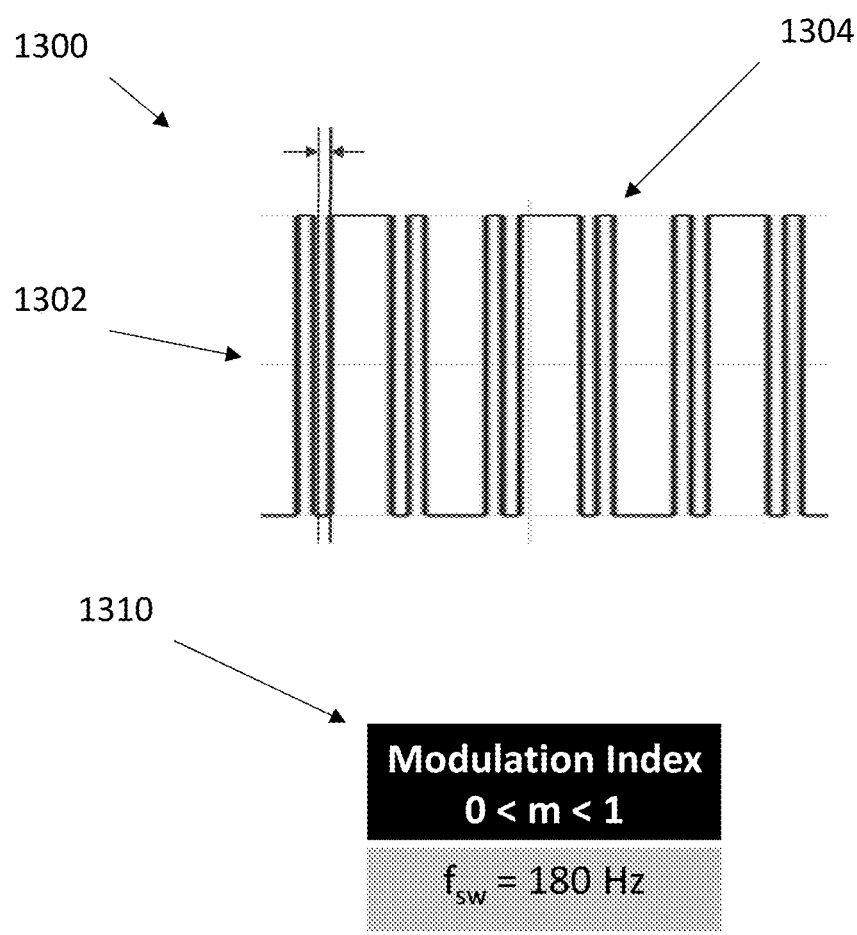
FIG. 13 is an another example front end rectifier switching control signal in one example of the front end control instance of FIG. 10.

FIG. 13 shows another example front end rectifier switching control signal diagram 1300 with a curve 1302. The modulator 420 in this example selectively controls a delay angle 1304 (α) in gating the power stage rectifier switches Q1-Q6 according to the computed modulation index m. In this implementation, the switching frequency is 180 Hz, due to 3 switching events per cycle, and a maximum modulation index $m_{max}$ is used at nominal operation to reduce low order harmonics of the secondary currents at normal operation, in which $$|V_{FFE}| = \frac{2V_{dc}}{\pi}(2m-1),$$

and the modulation index is the cosine of the delay angle (m=cos α).

Figure 14:
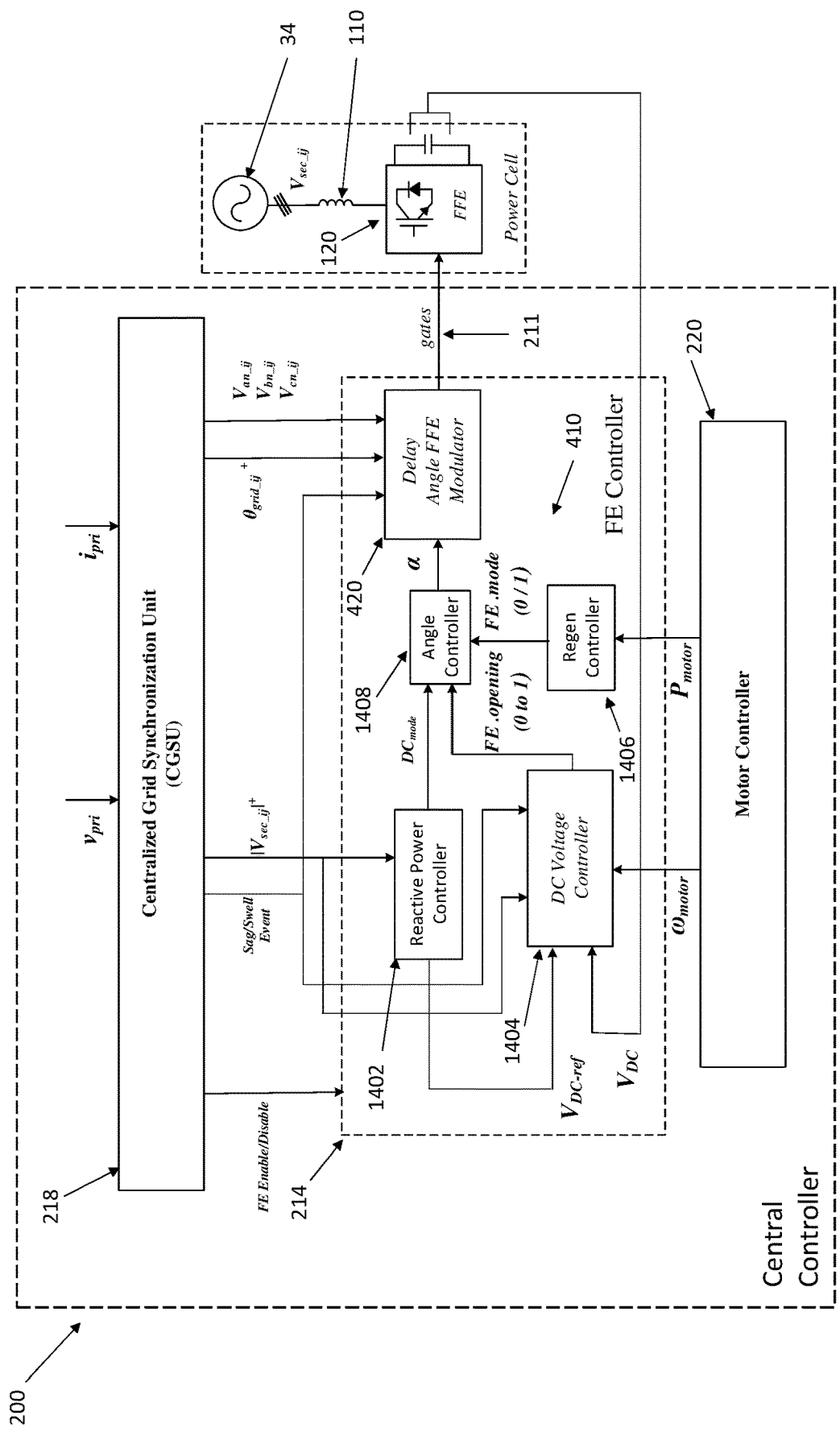
FIG. 14 is a schematic diagram of another example FFE front end control instance for a corresponding power stage in the power conversion system of FIG. 1.

FIG. 14 shows another example front end control instance 214 for a corresponding power stage 100 in the power conversion system 10 of FIG. 1. In this example, the individual front end controllers 214 include a reactive power controller 1402, a DC link voltage controller 1404, a regen controller 1406, an angle controller 1408, and a delay angle modulator 420. The reactive power controller 1402 provides a DC link voltage control mode signal $DC_{mode}$ and DC voltage reference $V_{DC\_ref}$ based on the secondary positive sequence voltage magnitude signal $|V_{sec\_ij}|^+$ corresponding to the respective front end controller 214. The DC link voltage controller 1404 configured to provide a front end opening signal "FE. Opening" in a range of 0 to 1 based on a DC voltage error signal and secondary positive sequence voltage magnitude signal $|V_{sec\_ij}|^+$ corresponding to the respective front end controller 214. DC link voltage controller may use $\omega_{motor}$ information for DC link voltage filtration. A regenerative controller 1406 provides a front end mode signal "FE. Mode" having a value of 0 or 1 based on a motor power $P_{motor}$ from the motor controller 220. The front end control instance 214 in this example also includes an angle controller 1408 that provides a delay angle signal α based on the front end opening signal "FE. Opening", the front end mode signal "FE. Mode", and DC link voltage control mode signal $DC_{mode}$. The modulator 420 provides the rectifier switching control signals 212 to the corresponding one of the regenerative power stages 100 based on the delay angle signal α and the secondary voltage waveforms signals $V_{an\_ij}$, $V_{bn\_ij}$, $V_{cn\_ij}$ or $\theta_{grid\_ij}^+$ of the corresponding one of the secondary circuits 34. The generated sag/swell event signal in grid synchronizer 218 based on primary voltage signal $v_{pri}$, determines FFE controller response during primary voltage transients. The generated FE enable/disable signal in grid synchronizer 218 based on a fault conditions or a system events, enables or disables the whole FFE controller.

This example provides FFE control with regeneration capability and DC link voltage regulation, in which the regen controller 1406 produces a binary signal (FE. Mode) that indicates the regeneration condition based on the motor power. The DC voltage controller 1404 main task is to regulate the DC link voltage to the nominal reference value during voltage sag events through the signal value (FE. Opening) to a value between 0 and 1 based on the error between the reference DC link voltage $V_{DC\-ref}$ and the measured DC link voltage $V_{DC}$ and the secondary positive sequence voltage magnitude signal. Another important task implemented in the DC link voltage controller is the FE input voltage transient compensation. This function requires $|V_{sec\_ij}|^+$ signal as an input and is activated in during transient meanwhile the main function of the DC link voltage controller is disabled. At regeneration, during normal operation, FE. Opening is set to 1, and during a voltage sag event FE. Opening is set between 0 and 1. This allows the FFE to regulate the DC link voltage according to $V_{dc} = \sqrt{2}*V_{grid(LL)}*f(FE. Opening)+\Delta V$, where $\Delta V$ is the voltage drop on equivalent inductance seen by the FFE front end 120.

Figures 15, 16:
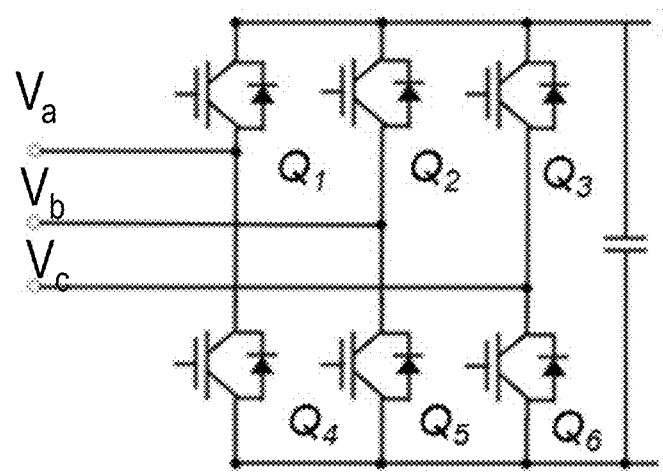
FIG. 15 is a table of angle control in an example of the front end control instance of FIG. 14.
FIG. 16 is a schematic diagram of a front end rectifier switch circuit of a power stage in the power conversion system of FIG. 1.

FIG. 15 shows a table 1500 of DC link voltage control mode signal $DC_{mode}$ and DC voltage reference $V_{DC\_ref}$ in one example of the front end control instance 214 of FIG. 14. In this example, at 1501 in response to the secondary positive sequence voltage magnitude signal $|V_{sec\_ij}|^+$ corresponding to the respective front end controller 214 being greater than or equal to a threshold TH, the reactive power controller 1402 provides DC link voltage control mode signal $DC_{mode}$ having a value of 1. This sets the angle controller to force the delay angle signal α having a value of 0 degrees and the front end controller 214 controls the DC voltage reference $V_{DC\_ref}$ between a first value $V_{DC,\ min}$ and a second value $V_{DC,\ max}$. At 1502, in response to the secondary positive sequence voltage magnitude signal $|V_{sec\_ij}|^+$ corresponding to the respective front end controller 214 being less than the threshold TH, the reactive power controller 1402 provides DC link voltage control mode signal $DC_{mode}$ having a value between 0 and 1. This sets the angle controller to allow the delay angle signal α having a value between 0 to 30 degrees and the front end controller 214 controls the DC voltage reference $V_{DC\_ref}$ at the first value $V_{DC,\ min}$.

Figure 17:
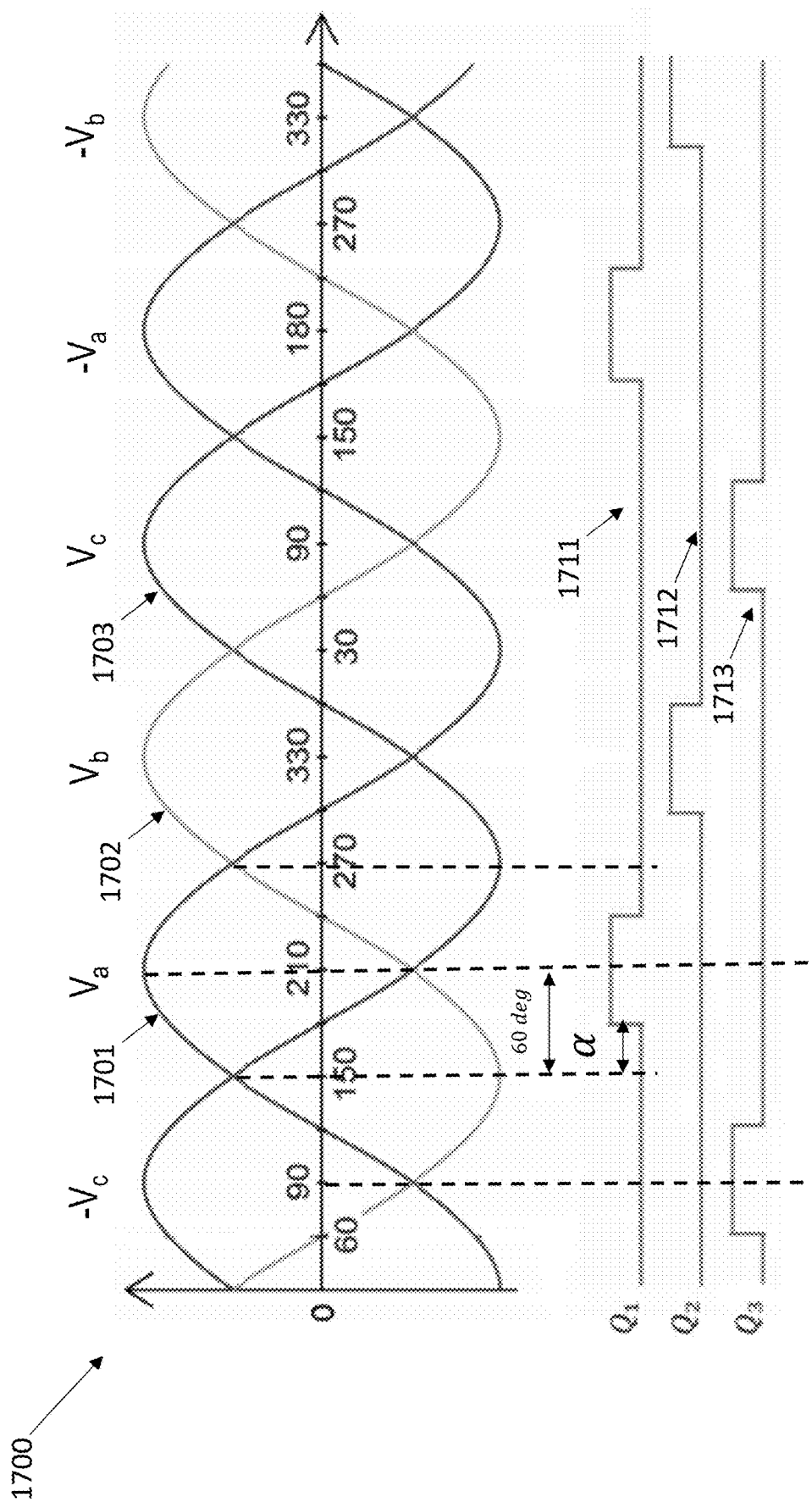
FIG. 17 is a signal diagram of AC input voltage and switching control signals in one example of the front end control instance of FIG. 14.

FIG. 16 shows a front end rectifier switch circuit 120 with switches Q1-Q6 of a power stage in the power conversion system of FIG. 1. FIG. 17 shows a signal diagram 1700 with curves 1701, 1702 and 1703 showing AC input voltages $V_{an}$, $V_{bn}$ and $V_{cn}$, respectively, representing the secondary voltage waveforms signals $V_{an\_ij}$, $V_{bn\_ij}$, $V_{cn\_ij}$ of the corresponding one of the secondary circuits 34 supplied into the modulator. Curves 1711, 1712 and 1713 illustrating switching control signals for switches Q1, Q2 and Q3, respectively in one example implementation of a modulator 420 in FIG. 14. In this example, the secondary voltage waveforms signals $V_{an\_ij}$, $V_{bn\_ij}$, $V_{cn\_ij}$ are used directly or $\theta_{grid\_ij}^+$ is used to generate sinusoidal voltage waveforms. Then either are fed to the modulator 420. The delay angle α for a given front end rectifier switch is measured at the instant when the corresponding phase is the most maximum or minimum as shown in FIG. 17. The switching control signals for switches show that delay angle α=0 degrees results in 120 degree conduction, and delay angle α>0 degrees results in symmetric conduction for 120-2α.

Figure 18:
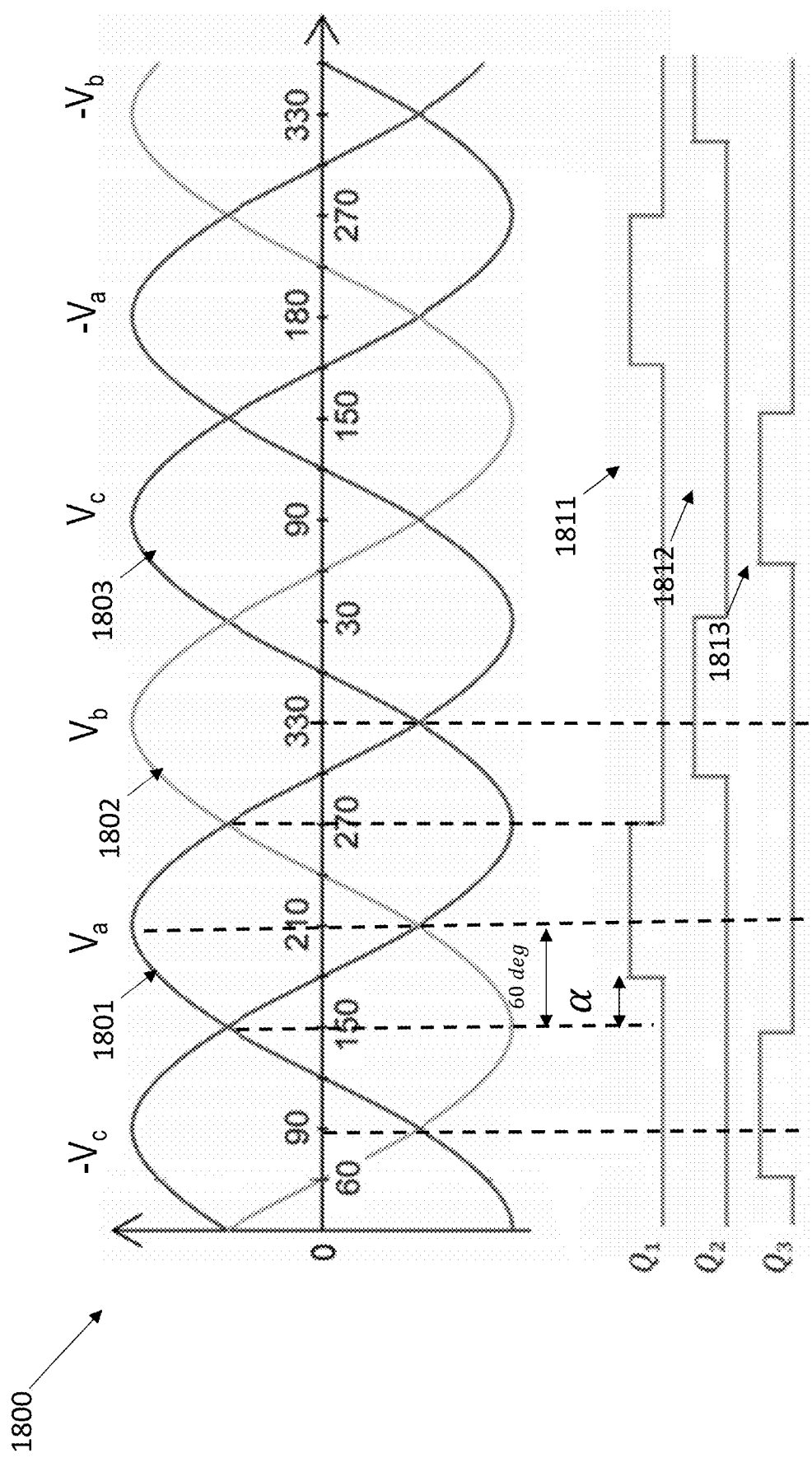
FIG. 18 is a signal diagram of AC input voltage and switching control signals in another example of the front end control instance of FIG. 14.

FIG. 18 shows another implementation of modulator 420 in FIG. 14. Curves 1801, 1802 and 1803 showing AC input voltages $V_{an}$, $V_{bn}$ and $V_{cn}$, respectively, representing the secondary voltage waveforms signals $V_{an\_ij}$, $V_{bn\_ij}$, $V_{cn\_ij}$ of the corresponding one of the secondary circuits 34 supplied into the modulator. Curves 1811, 1812 and 1813 illustrating switching control signals for switches Q1, Q2 and Q3, respectively. In this example, the secondary voltage waveforms signals $V_{an\_ij}$, $V_{bn\_ij}$, $V_{cn\_ij}$ are used directly or $\theta_{grid\_ij}^{+}$ is used to generate sinusoidal voltage waveforms. Then either are fed to the modulator 420. The delay angle α for a given front end rectifier switch is measured at the instant when the corresponding phase is the most maximum or minimum in FIG. 18. The switching control signals for switches show that delay angle α=0 degrees results in 120 degree conduction, and delay angle α>0 degrees results in asymmetric conduction for 120−α. Using the secondary voltage waveforms signals $V_{an\_ij}$, $V_{bn\_ij}$, $V_{cn\_ij}$ instead of using generated sinusoidal voltage waveforms from is $\theta_{grid\_ij}^{+}$ in the modulator 420, compensates for voltage unbalance more effectively.

Figure 19:
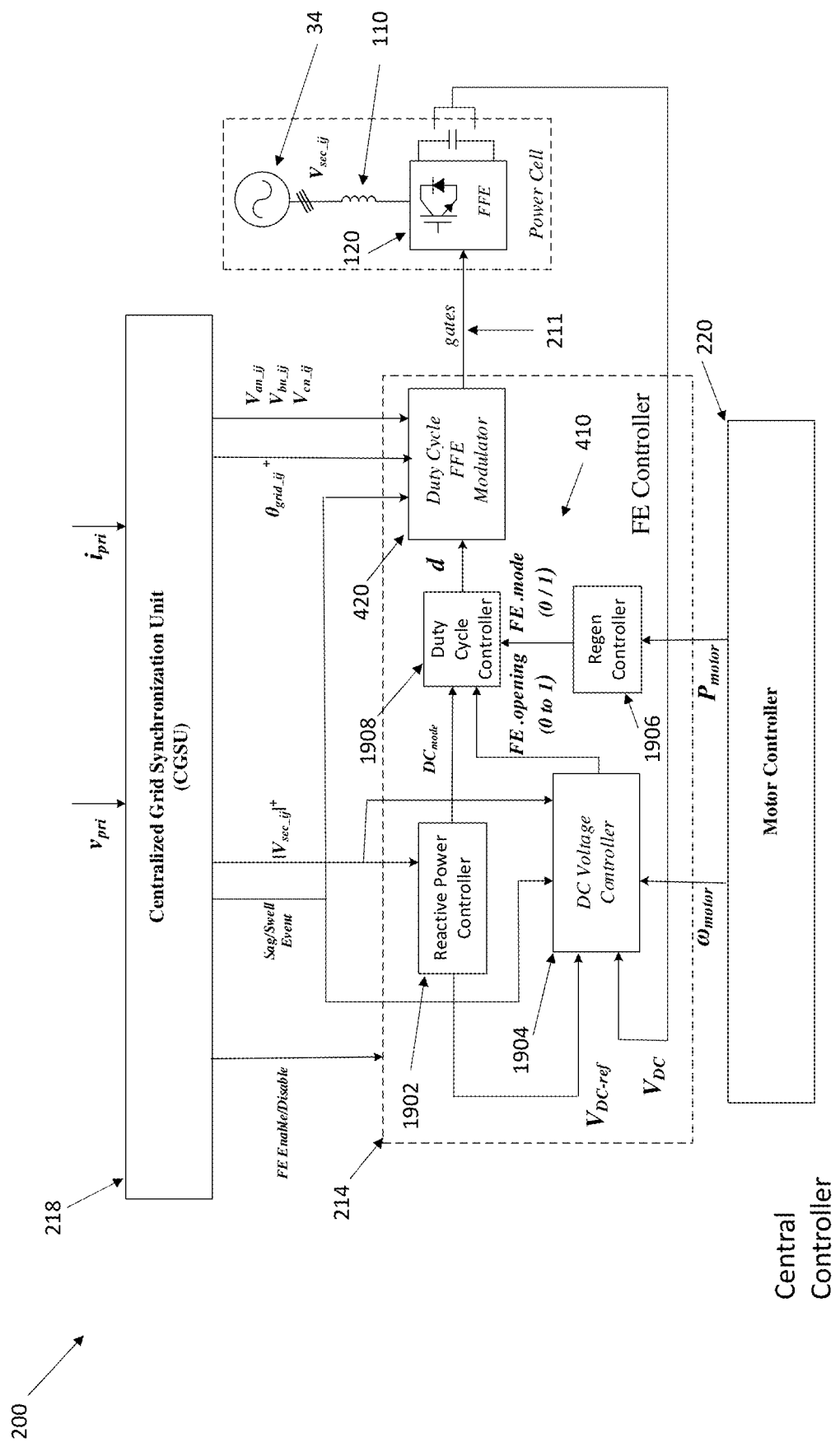
FIG. 19 is a schematic diagram of another example FFE front end control instance for a corresponding power stage in the power conversion system of FIG. 1.

FIG. 19 shows another example front end control instance 214 for a corresponding power stage 100 in the power conversion system 10 of FIG. 1. In this example, the individual front end controllers 214 include a reactive power controller 1902, a DC link voltage controller 1904, a regen controller 1906, a duty cycle controller 1908, and the duty FFE modulator 420. The reactive power controller 1902 provides a DC link voltage control mode signal DC mode and DC voltage reference $V_{DC\_ref}$ based on the secondary positive sequence voltage signal $|V_{sec\_ij}|^{+}$ corresponding to the respective front end controller 214. The DC link voltage controller 1904 configured to provide a front end opening signal "FE. Opening" in a range of 0 to 1 based on a DC voltage error signal and secondary positive sequence voltage magnitude signal $|V_{sec\_ij}|^{+}$ corresponding to the respective front end controller 214. DC link voltage controller may use $\omega_{motor}$ information for DC link voltage filtration. A regenerative controller 1906 provides a front end mode signal "FE. Mode" having a value of 0 or 1 based on a motor power $P_{motor}$ from the motor controller 220. The front end control instance 214 in this example also includes a duty cycle controller 1908 that provides a duty cycle signal d based on the front end opening signal "FE. Opening", the front end mode signal "FE. Mode", and DC link voltage control mode signal $DC_{mode}$. The modulator 420 provides the rectifier switching control signals 212 to the corresponding one of the regenerative power stages 100 based on the duty cycle signal d and the secondary voltage waveforms signals $V_{an\_ij}$, $V_{bn\_ij}$, $V_{cn\_ij}$ or $\theta_{grid\_ij}^{+}$ of the corresponding one of the secondary circuits 34. The generated sag/swell event signal in grid synchronizer 218 based on primary voltage signal $v_{pri}$, determines FFE controller response during primary voltage transients. The generated FE enable/disable signal in grid synchronizer 218 based on a fault conditions or a system events, enables or disables the whole FFE controller.

This example provides FFE control with regeneration capability and DC link voltage regulation, in which the regen controller 1906 produces a binary signal (FE. Mode) that indicates the regeneration condition based on the motor power. The DC voltage controller 1904 main task is to regulate the DC link voltage to the nominal reference value during voltage sag events through the signal value (FE. Opening) to a value between 0 and 1 based on the error between the reference DC link voltage $V_{DC\text{-}ref}$ and the measured DC link voltage $V_{DC}$. Another important task implemented in the DC link voltage controller is the FE input voltage transient compensation. This function requires secondary voltage positive sequence magnitude $|V_{sec\_ij}|^{+}$ signal as an input and is activated in during transient meanwhile the main function of the DC link voltage controller is disabled. At regeneration, during normal operation, FE. Opening is set to 1, and during a voltage sag event FE. Opening is set between 0 and 1. This allows the FFE to regulate the DC link voltage according to $V_{dc}= \sqrt{2}*V_{grid(LL)}*f(FE. Opening)+\Delta V$, where $\Delta V$ is the voltage drop on equivalent inductance seen by the FFE front end 120.

Figure 20:
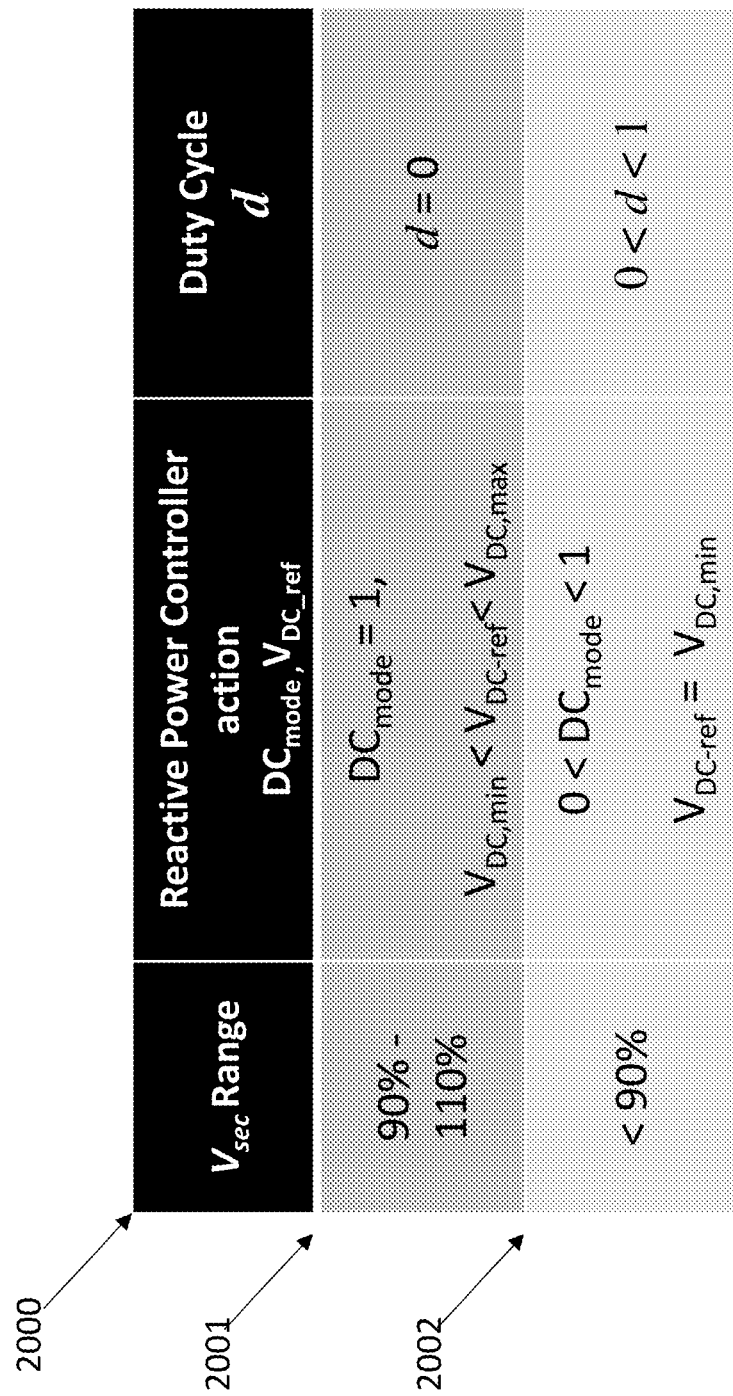
FIG. 20 is a table of angle control measurement in an example of the front end control instance of FIG. 19.

FIG. 20 shows a table 2000 of DC link voltage control mode signal $DC_{mode}$ and DC voltage reference $V_{DC\_ref}$ in one example of the front end control instance 214 of FIG. 18. In this example, at 2001 in response to the secondary positive sequence voltage signal $|V_{sec\_ij}|^{+}$ corresponding to the respective front end controller 214 being greater than or equal to a threshold TH, the reactive power controller 1902 provides DC link voltage control mode signal $DC_{mode}$ having a value of 1. This sets the duty cycle controller to force the duty cycle signal d having a value of 0 and the front end controller 214 controls the DC voltage reference $V_{DC\_ref}$ between a first value $V_{DC, min}$ and a second value $V_{DC, max}$. At 2002, in response to the secondary positive sequence voltage magnitude signal $|V_{sec\_ij}|^{+}$ corresponding to the respective front end controller 214 being less than the threshold TH, the reactive power controller 1902 provides DC link voltage control mode signal $DC_{mode}$ having a value between 0 and 1. This sets the duty cycle controller to allow the duty cycle signal d having a value between 0 to 1 and the front end controller 214 controls the DC voltage reference $V_{DC\_ref}$ at the first value $V_{DC, min}$.

Figure 21:
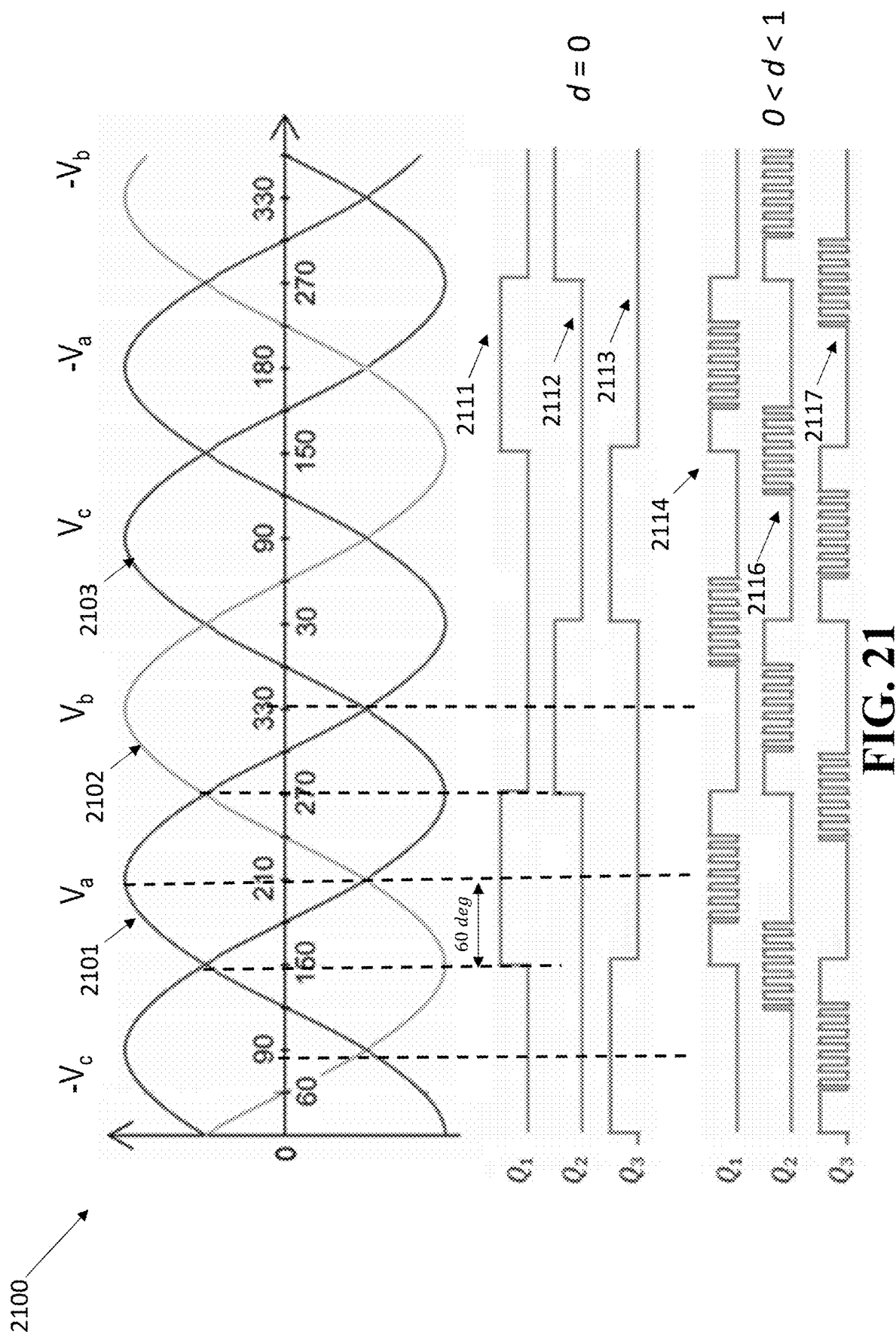
FIG. 21 is a signal diagram of AC input voltage and switching control signals of a power stage in the power conversion system of FIG. 19.

Based on front end rectifier switch circuit shown in FIG. 16, FIG. 21 shows a signal diagram 2100 with curves 2101, 2102 and 2103 showing AC input voltages $V_{an}$, $V_{bn}$ and $V_{cn}$, respectively, representing the secondary voltage waveforms signals $V_{an\_ij}$, $V_{bn\_ij}$, $V_{cn\_ij}$ of the corresponding one of the secondary circuits 34 supplied into the modulator. In this example, the secondary voltage waveforms signals $V_{an\_ij}$, $V_{bn\_ij}$, $V_{cn\_ij}$ are used directly or $\theta_{grid\_ij}^{+}$ is used to generate sinusoidal voltage waveforms. Then either are fed to the modulator 420. Curves 2111, 2112 and 2113 illustrating switching control signals for switches Q1, Q2 and Q3, respectively in case of duty cycle d=0. Curves 2121, 2122 and 2123 illustrating switching control signals for switches Q1, Q2 and Q3, respectively in case of duty cycle 0<d<1. Using the secondary voltage waveforms signals $V_{an\_ij}$, $V_{bn\_ij}$, $V_{cn\_ij}$ instead of using generated sinusoidal voltage waveforms from is $\theta_{grid\_ij}^{+}$ in the modulator 420, compensates for voltage unbalance more effectively.

Figure 22:
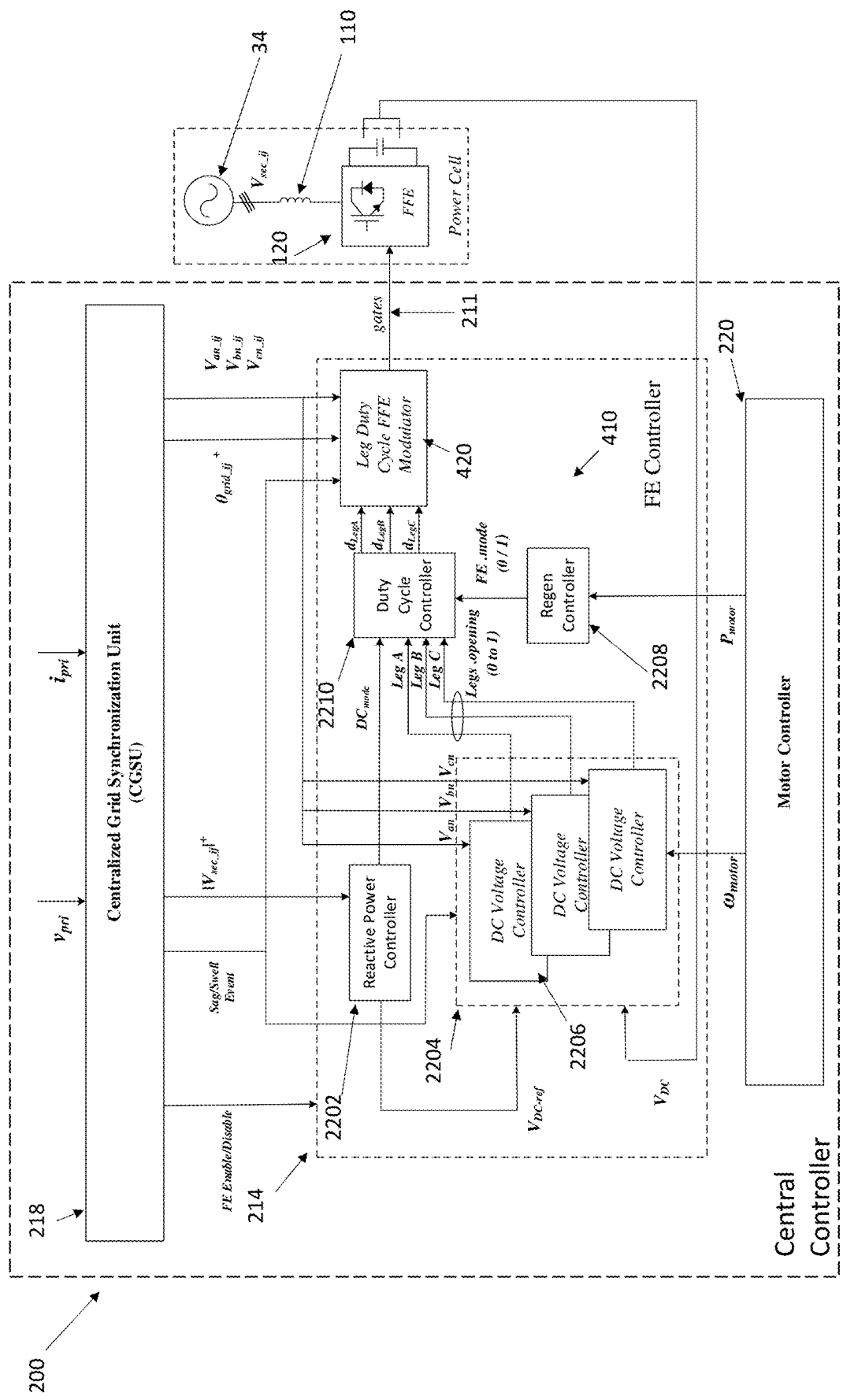
FIG. 22 is a schematic diagram of another example FFE front end control instance for a corresponding power stage in the power conversion system of FIG. 1.

FIG. 22 shows another example front end control instance 214 for a corresponding power stage 100 in the power conversion system 10 of FIG. 1. In this example, the individual front end controllers 214 include a reactive power controller 2202, a DC link voltage controller 2204 that consists of three controller instances 2206 corresponding to the three phases, a regen controller 2208, a duty cycle controller 2210, and the modulator 420. The reactive power controller 2202 provides a DC link voltage control mode signal $DC_{mode}$ and DC voltage reference $V_{DC\_ref}$ based on the secondary positive sequence voltage signal $|V_{sec\_ij}|^{+}$ corresponding to the respective front end controller 214. The DC link voltage controller instances 2206 main task is to provide front end leg opening signals "Leg. Opening" in a range of 0 to 1 based on a DC voltage error signal. Another important task implemented in DC link voltage controller instances 2206 is the FE input voltage transient compensation. This function requires $V_{an\_ij}$, $V_{bn\_ij}$, $V_{cn\_ij}$ signal as an input and is activated in during transient meanwhile the main function of the DC link voltage controller is disabled. Using the secondary voltage waveforms signals $V_{an\_ij}$, $V_{bn\_ij}$, $V_{cn\_ij}$ instead of using secondary positive sequence voltage signal $|V_{sec\_ij}|^{+}$ results in improved front end responses under voltage unbalance and asymmetric voltage sags. DC link voltage controller may use $\omega_{motor}$ information for DC link voltage filtration. A regenerative controller 2208 provides a front end mode signal "FE. Mode" having a value of 0 or 1 based on a motor power $P_{motor}$ from the motor controller 220. The front end control instance 214 in this example also includes a duty cycle controller 2210 that provides three duty cycle signals $d_1$, $d_2$, $d_3$ based on the three front end opening signal "Legs. Opening", the front end mode signal "FE. Mode", and DC link voltage control mode signal $DC_{mode}$. The modulator 420 provides the rectifier switching control signals 212 to the corresponding one of the regenerative power stages 100 based on the duty cycle signal signals $d_1$, $d_2$, $d_3$ and the secondary voltage waveforms signals $V_{an\_ij}$, $V_{bn\_ij}$, $i_{cn\_ij}$ or $\theta_{grid,ij}^+$ of the corresponding one of the secondary circuits 34. Using the secondary voltage waveforms signals $V_{an\_ij}$, $V_{bn\_ij}$, $V_{cn\_ij}$ instead of using generated sinusoidal voltage waveforms from is $\theta_{grid\_ij}^+$ in the modulator 420, compensates for voltage unbalance more effectively. The generated sag/swell event signal in grid synchronizer 218 based on primary voltage signal $v_{pri}$, determines FFE controller response during primary voltage transients. The generated FE enable/disable signal in grid synchronizer 218 based on a fault conditions or a system events, enables or disables the whole FFE controller.

Figure 23:
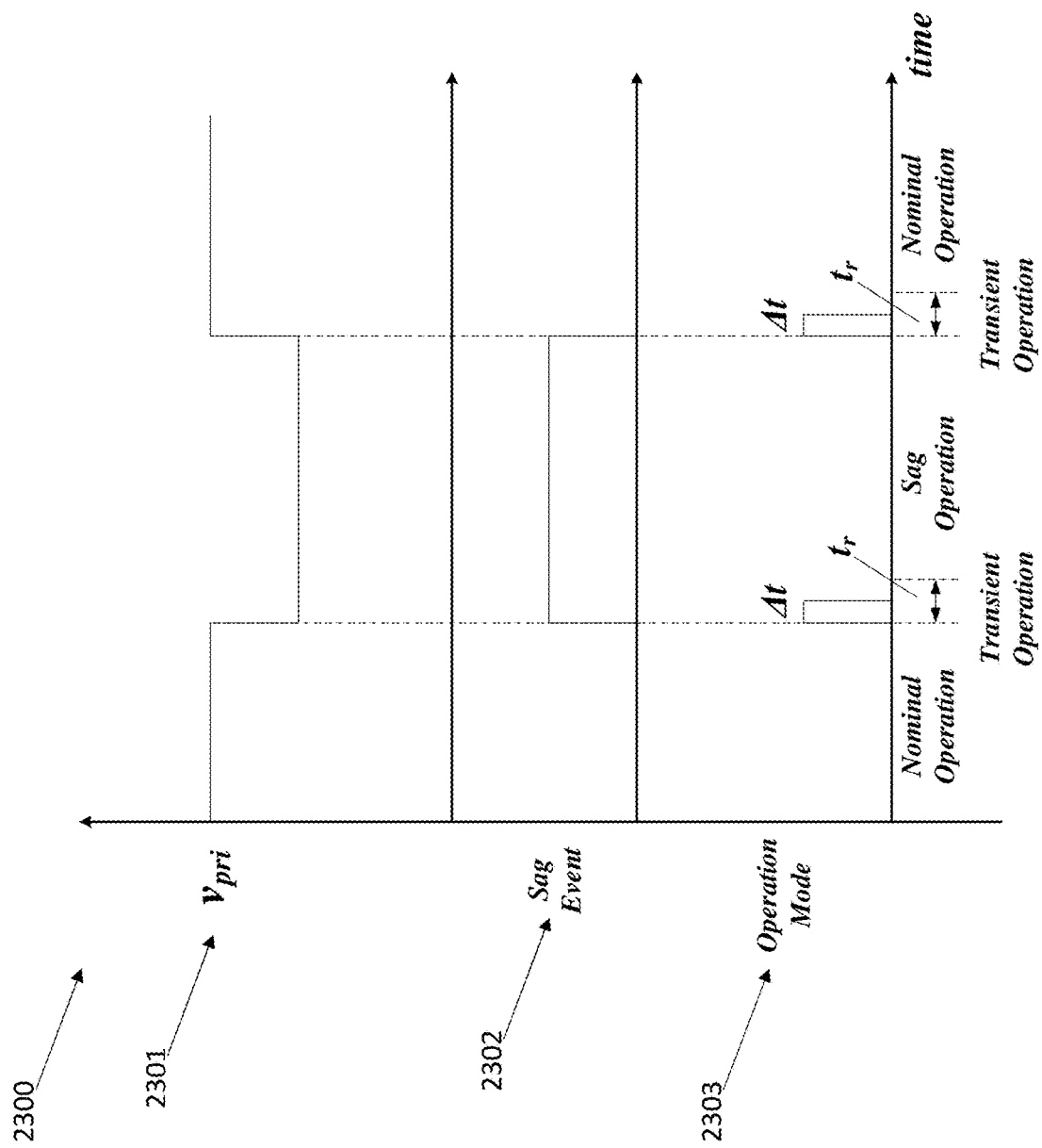
FIG. 23 is a front end control mode timing diagram during primary input voltage transients.
Figure 24:
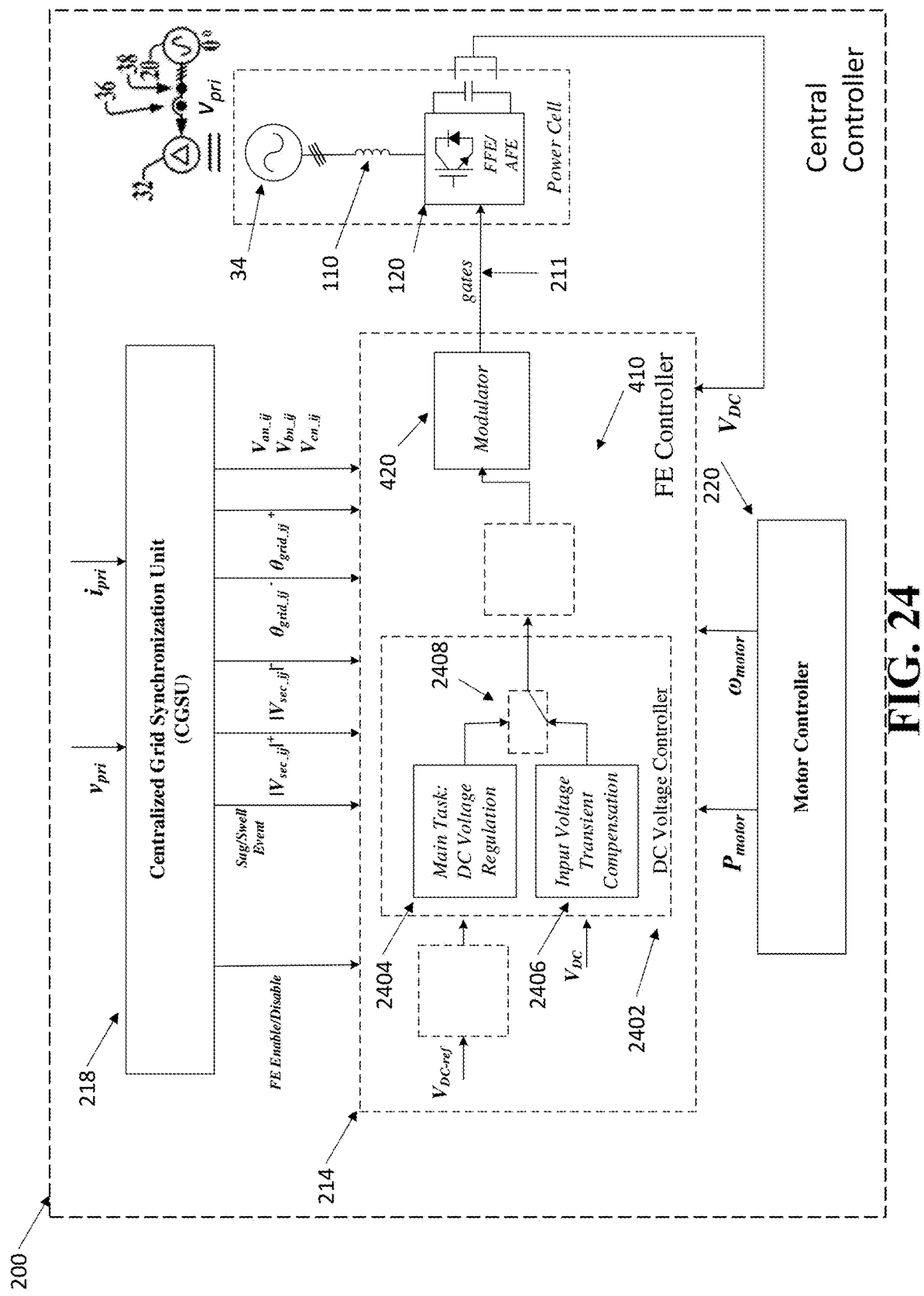
FIG. 24 is a schematic diagram of a front end control instance highlighting some control tasks during input voltage transients

Referring to FIG. 23 and FIG. 24, the FE controller mode timing diagram 2300 during transformer primary input voltage transients is shown in FIG. 23. Diagram 2301 shows primary voltage $v_{pri}$ dipping due to voltage sag. Based on this voltage sag event, the voltage sag/swell detection component 504 or 604 in the synchronizer 218 produces a sag/swell FE Mode signal to FE controller enable/disable component 506 or 606. Based on the logic in 506 or 606 it generates enable/disable signal to each of the FE controllers 214. In addition, it produces a sag/swell event signal to each of the FE controllers 214, which is only effective if the FE controller enable/disable component 506, 606 produces an enable signal to the FE controllers 214. Diagram 2302 shows the corresponding sag event. Diagram shows 2303 FE controller modes before, during, and after the sag event. At the start of the voltage sag event, the FE controller 214 transfers from normal operation mode to transient operation mode, after short transient time $t_r$ it transfers to sag operation mode. On primary voltage $v_{pri}$ restoration, the FE controller transfers to another short transient time $t_r$ then transfers back to normal operation mode. FIG. 24 shows a general block diagram for FE controller instance representing any of the examples provided in FIG. 7, FIG. 10, FIG. 14, FIG. 19, and FIG. 22. In all these examples, the DC link voltage controller 2402 has two tasks. The main task is DC link voltage regulation 2404 and the other task is FE input voltage transient compensation. The DC link voltage regulation task is executed by processor 201 in either the normal or the sag/swell operation modes. However, the FE input voltage transient compensation task is executed by processor 201 during transient operation mode. The output of the DC link voltage controller 2402 is determined based on selector 2408 whose control is derived from the sag/swell event signal logic. During normal or sag/swell operation modes, output of the DC link voltage controller 2402 is determined by the output of the DC link voltage regulation task 2404. During transient operation mode, output of the DC link voltage controller 2402 is determined by the output of the FE input voltage transient compensation 2408.

Figure 25:
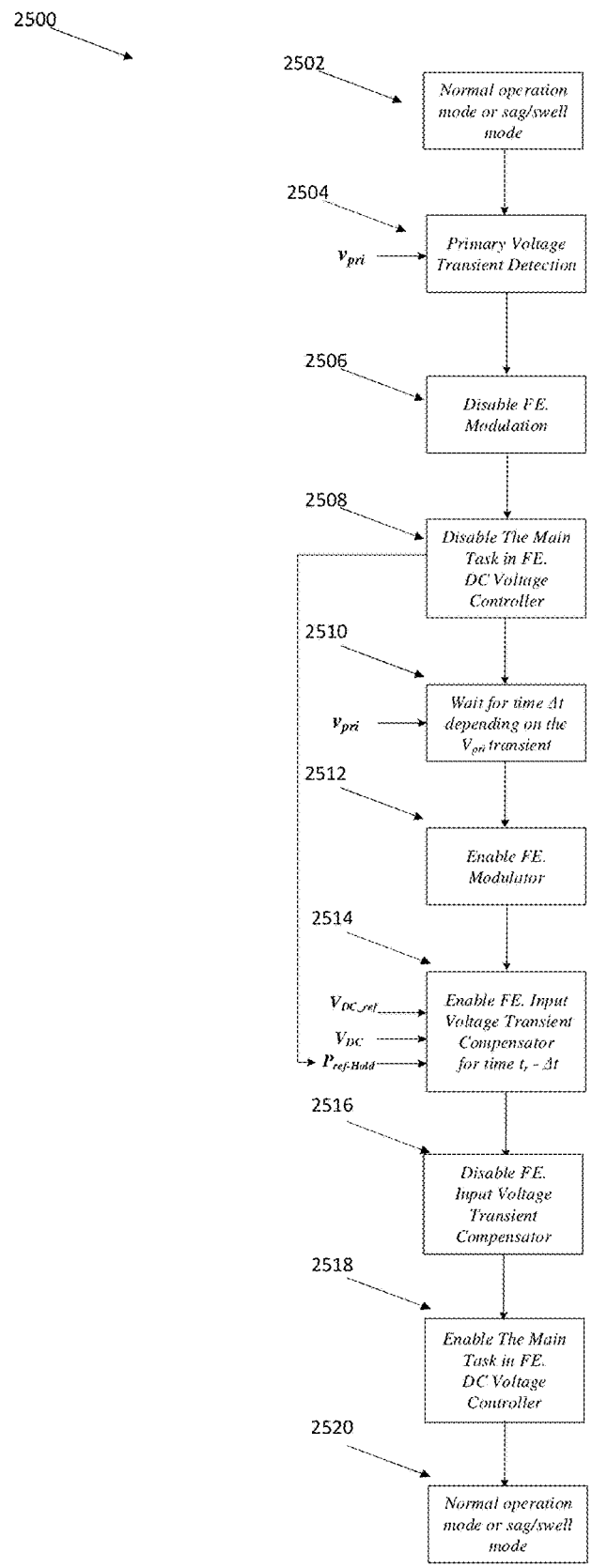
FIG. 25 is one example flow diagram for front end control mode change during input voltage transients.

In one example, the memory 202 of the central controller 200 is a non-transitory computer readable medium 202 that stores computer executable instructions, which, when executed by a processor 201, cause the processor 201 to implement the method 2400 shown in FIG. 25 to determine FE controller 214 response during transient operation mode shown in diagram 2300 in FIG. 23. This method is associated to the operation of FE controller examples in FIG. 7 and FIG. 10. In this example, at 2502, the computer executable instructions stored in the memory 202, when executed by the processor 201, cause the processor 201 to implement method 300 in FIG. 3 representing the FE controller's normal or sag/swell operation modes. In this example, at 2504, the computer executable instructions stored in the memory 202, when executed by the processor 201, cause the processor 201 to execute voltage sag/swell detection component 504 or 604 in synchronizer 218 based on primary voltage $v_{pri}$. On detecting a primary voltage transient, the computer executable instructions stored in the memory 202, when executed by the processor 201, cause the processor 201 to force the sag/swell event signal to go from 0 to 1 or from 1 to 0. In response to the change in the sag/swell event signal, in this example, at 2506, the computer executable instructions stored in the memory 202, when executed by the processor 201, cause the processor 201 to disable modulation component 420 in each FE controller 214.

In this example, at 2508, the computer executable instructions stored in the memory 202, when executed by the processor 201, cause the processor 201 to disable the feedback mechanism and hold the output $P_{ref}$ of the main task in DC link voltage controller component 704 or 1004 in 410 in each FE controller 214. This hold $P_{ref}$ value represents the active power reference the front end is required provide just before the sag/swell event. In this example, at 2510, the computer executable instructions stored in the memory 202, when executed by the processor 201, cause the processor 201 to wait for time $\Delta t$ calculated based on the primary voltage transient. In this example, at 2512, the computer executable instructions stored in the memory 202, when executed by the processor 201, cause the processor 201 to enable modulation component 420 in each FE controller 214. In this example, at 2514, the computer executable instructions stored in the memory 202, when executed by the processor 201, cause the processor 201 to enable and execute FE input voltage transient compensator instead of the main task in DC link voltage controller component to produce $P_{ref}$ signal based on $V_{DC}$, $V_{DC\_ref}$, and the hold $P_{ref}$ for time $t_r - \Delta t$ calculated based on the design. In this example, at 2516, the computer executable instructions stored in the memory 202, when executed by the processor 201, cause the processor 201 to disable the FE input voltage transient compensator. In this example, at 2518, the computer executable instructions stored in the memory 202, when executed by the processor 201, cause the processor 201 to enable the main task in DC link voltage controller component 704 and 1004 in 410 in each FE controller 214. In this example, at 2520, the computer executable instructions stored in the memory 202, when executed by the processor 201, causes the processor 201 to implement method 300 in FIG. 3 representing the FE controller normal or sag/swell operation modes.

Figure 26:
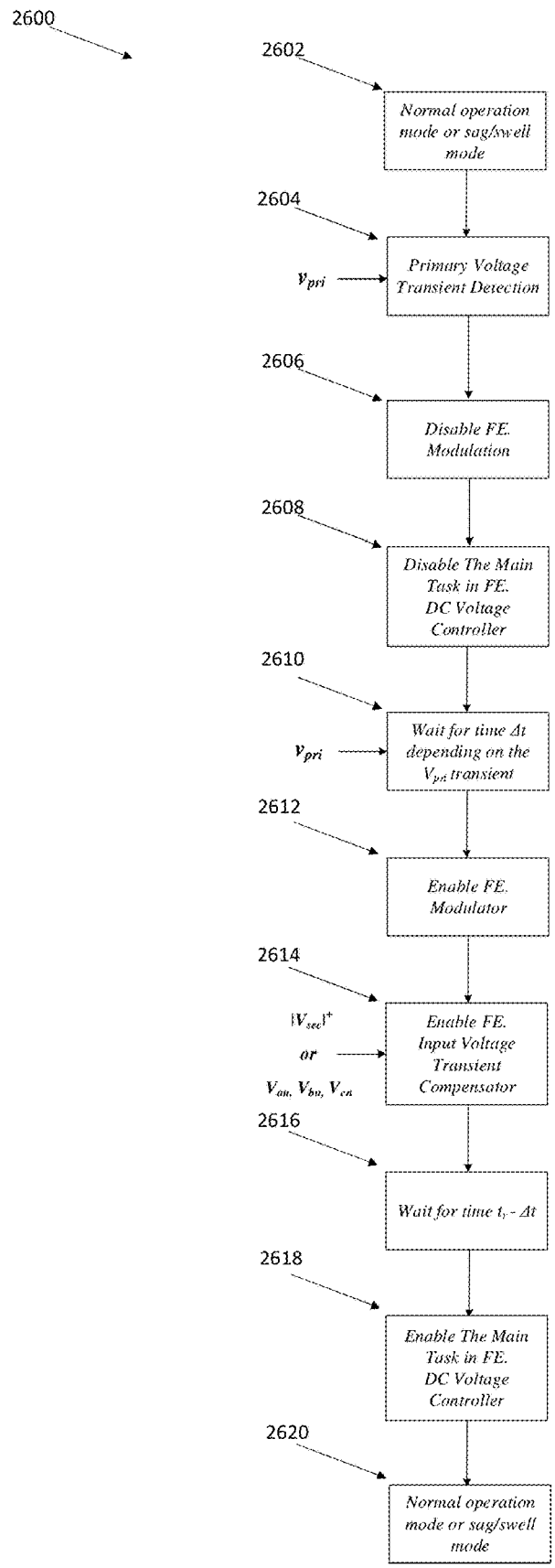
FIG. 26 is another example flow diagram for front end control mode change during input voltage transients.

In another example, the memory 202 of the central controller 200 is a non-transitory computer readable medium 202 that stores computer executable instructions, which, when executed by a processor 201, cause the processor 201 to implement the method 2600 shown in FIG. 26 to determine FE controller 214 response during transient operation mode shown in diagram 2300 in FIG. 23. This method is associated to the operation of FE controller example in FIG.

14, FIG. 19 and FIG. 22. In this example, at 2602, the computer executable instructions stored in the memory 202, when executed by the processor 201, cause the processor 201 to implement method 300 in FIG. 3 representing the FE controller's normal or sag/swell operation modes. In this example, at 2604, the computer executable instructions stored in the memory 202, when executed by the processor 201, cause the processor 201 to execute voltage sag/swell detection component 504 or 604 in synchronizer 218 based on primary voltage $v_{pri}$. On detecting a primary voltage transient, the computer executable instructions stored in the memory 202, when executed by the processor 201, cause the processor 201 to force the sag/swell event signal to go from 0 to 1 or from 1 to 0. In response to the change in the sag/swell event signal, in this example, at 2606, the computer executable instructions stored in the memory 202, when executed by the processor 201, cause the processor 201 to disable modulation component 420 in each FE controller 214.

In this example, at 2608, the computer executable instructions stored in the memory 202, when executed by the processor 201, cause the processor 201 to disable the main task in DC link voltage controller component 1404, 1904, or 2204 in 410 in each FE controller 214. In this example, at 2610, the computer executable instructions stored in the memory 202, when executed by the processor 201, cause the processor 201 to wait for time Δt calculated based on the primary voltage transient. In this example, at 2612, the computer executable instructions stored in the memory 202, when executed by the processor 201, cause the processor 201 to enable modulation component 420 in each FE controller 214. In this example, at 2614, the computer executable instructions stored in the memory 202, when executed by the processor 201, cause the processor 201 to enable and execute the FE input voltage transient compensator instead of the main task in DC link voltage controller component to produce the "FE. Opening" or "Legs. Opening" signals based on the secondary positive sequence voltage magnitude signal $|V_{sec\_ij}|^+$ or secondary voltage waveform signals $V_{an\_ij}$, $V_{bn\_ij}$, $V_{cn\_ij}$. In this example, at 2616, the computer executable instructions stored in the memory 202, when executed by the processor 201, cause the processor 201 to wait for time $t_r$–Δt calculated based on the design. In this example, at 2618, the computer executable instructions stored in the memory 202, when executed by the processor 201, cause the processor 201 to enable the main task in DC link voltage controller component 1404, 1904, or 2204 in 410 in each FE controller 214. In this example, at 2620, the computer executable instructions stored in the memory 202, when executed by the processor 201, causes the processor 201 to implement method 300 in FIG. 3 representing the FE controller normal or sag/swell operation modes.

Another aspect provides a method of making a regenerative power conversion system 10, including programming a non-transitory computer readable medium (e.g., central controller memory 202) by storing therein computer executable instructions, which, when executed by a processor 201 of the controller 200, cause the processor 201 to implement the control aspects illustrated and described herein.

Various embodiments have been described with reference to the accompanying drawings. Modifications and changes may be made thereto, and additional embodiments may be implemented, without departing from the broader scope of the invention as set forth in the claims that follow. The specification and drawings are accordingly to be regarded in an illustrative rather than restrictive sense. The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A regenerative power conversion system, comprising:
   a phase shift transformer having a primary circuit and N secondary sets of M secondary circuits, N being an integer greater than 2, M being an integer greater than 0, secondary circuits of individual secondary sets being in phase with one another, and secondary circuits of different secondary sets being out of phase with one another;
   M phase circuits, the individual phase circuits having N regenerative power stages, the individual regenerative power stages comprising:
   a DC link circuit including at least one capacitor coupled between first and second DC link nodes,
   a switching rectifier, including rectifier switching devices individually coupled between a respective one of the secondary circuits and a respective one of the first and second DC link nodes,
   a power stage output, and
   a switching inverter, including inverter switching devices individually coupled between a respective one of the first and second DC link nodes and the power stage output; and
   a controller configured to synchronize rectifier switching control signals provided to the rectifier switching devices of each regenerative power stage to a phase angle of a corresponding one of the secondary circuit based on a feedback signal of the primary circuit during regenerative operation of the power conversion system;
   the switching rectifiers of the N multiple regenerative power stages of each phase circuit coupled to a respective one of the secondary circuits of a respective one of the N secondary sets; and
   the power stage outputs of the N multiple regenerative power stages of each phase circuit connected in series.

2. The power conversion system of claim 1, wherein M is greater than 2.

3. The power conversion system of claim 1, wherein the controller comprises:
   a synchronizer configured to generate M×N secondary angle signals and M×N secondary voltage signals based on the feedback signal of the primary circuit, each individual secondary angle signal representing a phase angle of a corresponding one of the secondary circuits, and each secondary voltage signal representing a voltage of the corresponding one of the secondary circuits; and
   M×N front end controllers individually associated with a corresponding one of the secondary circuits and a corresponding one of the regenerative power stages, each individual front end controller configured to provide the rectifier switching control signals to the corresponding one of the regenerative power stages based on the secondary angle signal representing the phase angle of the corresponding one of the secondary circuits and the secondary voltage signal representing the voltage of the corresponding one of the secondary circuits.

4. The power conversion system of claim 3, wherein the synchronizer comprises:
   a phase locked loop (PLL) configured to provide a primary phase angle signal representing a phase angle of the primary circuit based on the feedback signal of the primary circuit; and
   a transformer model configured to provide the secondary angle signals to the corresponding front end controllers based on the primary phase angle signal.

5. The power conversion system of claim 3, wherein the individual front end controllers comprise:
   a reactive power controller configured to provide a modulation index based on the secondary voltage signal corresponding to the respective front end controller;
   a DC link voltage controller configured to provide a power reference signal based on a DC voltage error signal and a motor control power setpoint;
   an active power controller configured to provide a power angle signal based on the power reference signal and the secondary voltage signal corresponding to the respective front end controller; and
   a modulator configured to provide the rectifier switching control signals to the corresponding one of the regenerative power stages based on the modulation index, the
   power angle signal and the secondary angle signal representing the phase angle of the corresponding one of the secondary circuits.

6. The power conversion system of claim 5, wherein the synchronizer comprises:
   a phase locked loop (PLL) configured to provide a primary phase angle signal representing a phase angle of the primary circuit based on the feedback signal of the primary circuit; and
   a transformer model configured to provide the secondary angle signals to the corresponding front end controllers based on the primary phase angle signal.

7. The power conversion system of claim 5 wherein: in response to the secondary voltage signal corresponding to the respective front end controller being greater than or equal to a threshold: the reactive power controller is configured to provide the modulation index having a value of 1, and the front end controller is configured to control a DC voltage reference between a first value and a second value; and
   in response to the secondary voltage signal corresponding to the respective front
   end controller being less than the threshold: the reactive power controller is configured to provide the modulation index having a value between 0 and 1 based on the secondary voltage signal corresponding to the respective front end controller, and the front end controller is configured to control the DC voltage reference at the first value.

8. The power conversion system of claim 5 wherein:
   in response to the secondary voltage signal corresponding to the respective front end controller being at a nominal value: the reactive power controller is configured to provide the modulation index having a value of 1, and the front end controller is configured to control a DC voltage reference at a rated value;

in response to the secondary voltage signal corresponding to the respective front end controller being greater than or equal to a threshold and not equal to the nominal value: the reactive power controller is configured to provide the modulation index having a value of 1, and the front end controller is configured to control the DC voltage reference between a first value and a second value;
   in response to the secondary voltage signal corresponding to the respective front end controller being less than the threshold: the reactive power controller is configured to provide the modulation index having a value between 0 and 1 based on the secondary voltage signal corresponding to the respective front end controller, and the front end controller is configured to control the DC voltage reference at the first value.

9. The power conversion system of claim 3, wherein the individual front end controllers comprise:
   a DC voltage controller configured to provide a front end opening signal in a range of 0 to 1 based on a DC voltage error signal and secondary voltage signal corresponding to the respective front end controller;
   a regenerative controller configured to provide a front end mode signal having a value of 0 or 1 based on a motor control power setpoint; and
   an angle controller configured to provide a delay angle signal based on the front end opening signal and the front end mode signal; and
   wherein the modulator is configured to provide the rectifier switching control signals to the corresponding one of the regenerative power stages based on the delay angle signal.

10. The power conversion system of claim 9, wherein the synchronizer comprises:
    a phase locked loop (PLL) configured to provide a primary phase angle signal representing a phase angle of the primary circuit based on the feedback signal of the primary circuit; and
    a transformer model configured to provide the secondary angle signals to the corresponding front end controllers based on the primary phase angle signal.

11. The power conversion system of claim 9, wherein the angle controller is configured:
    in response to the secondary voltage signal equaling a nominal value, to provide the delay angle signal having a value of 0 degrees; and
    in response to the secondary voltage signal being less than the nominal value, to provide the delay angle signal having a value of 0 to 30 degrees.

12. The power conversion system of claim 1, wherein the power conversion system has no sensors associated with the secondary circuits of the phase shift transformer.

13. A non-transitory computer readable medium that stores computer executable instructions, which, when executed by a processor, cause the processor to:
    sample a feedback signal of a primary circuit of a phase shift transformer; and
    based on the feedback signal of the primary circuit during regenerative operation of a power conversion system, synchronize rectifier switching control signals provided to rectifier switching devices of each regenerative power stage coupled to a respective secondary circuit of the phase shift transformer, to a phase angle of the respective secondary circuit.

14. The non-transitory computer readable medium of claim 13, that stores further computer executable instructions, which, when executed by the processor, cause the processor to:
generate M×N secondary voltage signals based on the feedback signal of the primary circuit, each secondary voltage signal representing a voltage of the corresponding one of the secondary circuits;
generate M×N secondary angle signals based on the feedback signal of the primary circuit, each individual secondary angle signal representing a phase angle of a corresponding one of the secondary circuits; and
provide the rectifier switching control signals to corresponding regenerative power stages based on the secondary angle signal representing the phase angle of the corresponding one of the secondary circuits and the secondary voltage signal representing the voltage of the corresponding one of the secondary circuits.

15. The non-transitory computer readable medium of claim 14, having further computer executable instructions, which, when executed by the processor, cause the processor to:
using a transformer model, provide the secondary angle signals to the corresponding front end controllers based on a primary phase angle signal from a PLL.

16. The non-transitory computer readable medium of claim 14, having further computer executable instructions, which, when executed by the processor, cause the processor to:
provide a modulation index based on the secondary voltage signal corresponding to the respective front end controller;
provide a power reference signal based on a DC voltage error signal and a motor control power setpoint;
provide a power angle signal based on the power reference signal and the secondary voltage signal corresponding to the respective front end controller; and
provide the rectifier switching control signals to the corresponding one of the regenerative power stages based on the modulation index, the power angle signal and the secondary angle signal representing the phase angle of the corresponding one of the secondary circuits.

17. The non-transitory computer readable medium of claim 14, having further computer executable instructions, which, when executed by the processor, cause the processor to:
provide a front end opening signal in a range of 0 to 1 based on a DC voltage error signal and secondary voltage signal corresponding to the respective front end controller;
provide a front end mode signal having a value of 0 or 1 based on a motor control power setpoint; and
provide a delay angle signal based on the front end opening signal and the front end mode signal; and
provide the rectifier switching control signals to the corresponding one of the regenerative power stages based on the delay angle signal.

18. A method of making a regenerative power conversion system, the method comprising:
storing, in a non-transitory computer readable medium of a controller of the regenerative power conversion system, computer executable instructions, which, when executed by a processor of the controller, cause the processor to:
sample a feedback signal of a primary circuit of a phase shift transformer; and
based on the feedback signal of the primary circuit during regenerative operation of the power conversion system, synchronize rectifier switching control signals provided to rectifier switching devices of each regenerative power stage coupled to a respective secondary circuit of the phase shift transformer, to a phase angle of the respective secondary circuit.

19. The method of claim 18, further comprising:
storing, in the non-transitory computer readable medium, further computer executable instructions, which, when executed by a processor of the controller, cause the processor to:
generate M×N secondary voltage signals based on the feedback signal of the primary circuit, each secondary voltage signal representing a voltage of the corresponding one of the secondary circuits;
generate M×N secondary angle signals based on the feedback signal of the primary circuit, each individual secondary angle signal representing a phase angle of a corresponding one of the secondary circuits; and
provide the rectifier switching control signals to corresponding regenerative power stages based on the secondary angle signal representing the phase angle of the corresponding one of the secondary circuits and the secondary voltage signal representing the voltage of the corresponding one of the secondary circuits.

20. The method of claim 19, further comprising:
storing, in the non-transitory computer readable medium, further computer executable instructions, which, when executed by a processor of the controller, cause the processor to:
provide a modulation index based on the secondary voltage signal corresponding to the respective front end controller;
provide a power reference signal based on a DC voltage error signal and a motor control power setpoint;
provide a power angle signal based on the power reference signal and the secondary voltage signal corresponding to the respective front end controller; and
provide the rectifier switching control signals to the corresponding one of the regenerative power stages based on the modulation index, the power angle signal and the secondary angle signal representing the phase angle of the corresponding one of the secondary circuits.

21. The method of claim 19, further comprising:
storing, in the non-transitory computer readable medium, further computer executable instructions, which, when executed by a processor of the controller, cause the processor to:
provide a front end opening signal in a range of 0 to 1 based on a DC voltage error signal and secondary voltage signal corresponding to the respective front end controller;
provide a front end mode signal having a value of 0 or 1 based on a motor control power setpoint; and
provide a delay angle signal based on the front end opening signal and the front end mode signal; and
provide the rectifier switching control signals to the corresponding one of the regenerative power stages based on the delay angle signal.

* * * * *